(12) United States Patent
Hong et al.

(10) Patent No.: US 12,058,814 B2
(45) Date of Patent: Aug. 6, 2024

(54) POWER MODULE AND MANUFACTURING METHOD THEREOF

(71) Applicant: Delta Electronics (Shanghai) Co., Ltd., Shanghai (CN)

(72) Inventors: Shouyu Hong, Shanghai (CN); Jinping Zhou, Shanghai (CN); Min Zhou, Shanghai (CN); Xiaoni Xin, Shanghai (CN); Pengkai Ji, Shanghai (CN); Kai Lu, Shanghai (CN); Le Liang, Shanghai (CN); Zhenqing Zhao, Shanghai (CN)

(73) Assignee: DELTA ELECTRONICS (SHANGHAI) CO., LTD., Shanghai (CN)

(*) Notice: Subject to any disclaimer, the term of this patent is extended or adjusted under 35 U.S.C. 154(b) by 1041 days.

(21) Appl. No.: 16/862,109

(22) Filed: Apr. 29, 2020

(65) Prior Publication Data

US 2020/0260586 A1    Aug. 13, 2020

Related U.S. Application Data

(63) Continuation-in-part of application No. 16/130,850, filed on Sep. 13, 2018, now Pat. No. 11,277,067, (Continued)

(30) Foreign Application Priority Data

| Mar. 3, 2016 | (CN) | ......................... 201610120906.6 |
| Aug. 1, 2018 | (CN) | ......................... 201810866709.8 |
| May 15, 2019 | (CN) | ......................... 201910402768.4 |

(51) Int. Cl.
*H05K 1/18* (2006.01)
*H01F 27/24* (2006.01)
(Continued)

(52) U.S. Cl.
CPC ............ *H05K 1/181* (2013.01); *H01F 27/24* (2013.01); *H01F 27/292* (2013.01);
(Continued)

(58) Field of Classification Search
CPC .......... H05K 1/181; H05K 1/14; H05K 1/185; H05K 3/24; H05K 3/32; H05K 3/36; (Continued)

(56) References Cited

U.S. PATENT DOCUMENTS

| 4,117,588 A | 10/1978 | Johnson |
| 6,713,162 B2 | 3/2004 | Takaya et al. |

(Continued)

FOREIGN PATENT DOCUMENTS

| CN | 102790513 A | 11/2012 |
| CN | 103430256 A | 12/2013 |

(Continued)

*Primary Examiner* — Ishwarbhai B Patel
(74) *Attorney, Agent, or Firm* — KIRTON McCONKIE; Evan R. Witt

(57) ABSTRACT

A power module and a manufacturing method thereof are disclosed. The power module includes a first board, a magnetic component, a second board and a power device. The first board includes a conductive component disposed between a first side and a second side opposite to each other. The magnetic component is disposed between the first side and the second side and includes a magnetic core and a winding. A first conductive terminal and a second conductive terminal are led out on the first side and the second side, respectively. The second board is disposed on the first board and includes a third side and a fourth side opposite to each other. The fourth side faces the first side. The power device is disposed on the third side of the second board and electrically connected to the first board.

23 Claims, 23 Drawing Sheets

Related U.S. Application Data which is a continuation-in-part of application No. 15/158,016, filed on May 18, 2016, now Pat. No. 10,117,334.

(51) Int. Cl.

| | | |
|---|---|---|
| *H01F 27/29* | (2006.01) | |
| *H01F 41/076* | (2016.01) | |
| *H05K 1/14* | (2006.01) | |
| *H05K 3/24* | (2006.01) | |
| *H05K 3/32* | (2006.01) | |
| *H05K 3/36* | (2006.01) | |
| *H05K 3/46* | (2006.01) | |

(52) U.S. Cl.
CPC ............ *H01F 41/076* (2016.01); *H05K 1/14* (2013.01); *H05K 1/185* (2013.01); *H05K 3/24* (2013.01); *H05K 3/32* (2013.01); *H05K 3/36* (2013.01); *H05K 3/4644* (2013.01); *H05K 2201/1003* (2013.01)

(58) Field of Classification Search
CPC ......... H05K 3/4644; H05K 2201/1003; H05K 1/0263; H05K 1/186; H05K 1/144; H05K 1/165; H05K 1/188; H05K 3/34; H05K 3/4046; H05K 2201/086; H05K 2201/10166; H01F 27/24; H01F 27/292; H01F 41/076; H01F 17/0013; H01F 17/04

See application file for complete search history.

(56) References Cited

U.S. PATENT DOCUMENTS

| | | | |
|---|---|---|---|
| 7,864,017 B2 | 1/2011 | Fujiwara et al. | |
| 7,948,057 B2 | 5/2011 | Furukawa et al. | |
| 2008/0029907 A1 | 2/2008 | Koduri | |
| 2008/0054426 A1 | 3/2008 | Ohno et al. | |
| 2008/0303624 A1 | 12/2008 | Yamada et al. | |
| 2008/0309442 A1 | 12/2008 | Hebert | |
| 2010/0087036 A1* | 4/2010 | Lotfi | H01L 23/49589 438/122 |
| 2010/0225434 A1 | 9/2010 | Wang et al. | |
| 2011/0182039 A1* | 7/2011 | Kato | H01L 23/49822 361/736 |
| 2011/0284989 A1 | 11/2011 | Umeno | |
| 2013/0056847 A1 | 3/2013 | Chen | |
| 2013/0223033 A1* | 8/2013 | Mano | H05K 1/185 336/200 |
| 2013/0342301 A1* | 12/2013 | Mano | H01F 41/041 336/200 |
| 2014/0085848 A1* | 3/2014 | Zeng | H01F 27/29 361/768 |
| 2014/0111273 A1 | 4/2014 | Jou et al. | |
| 2014/0218155 A1* | 8/2014 | Akre | H05K 1/141 29/832 |
| 2014/0251669 A1* | 9/2014 | Manusharow | H05K 1/183 174/260 |
| 2014/0347825 A1* | 11/2014 | Guo | H05K 1/165 336/200 |
| 2015/0055315 A1 | 2/2015 | Lu et al. | |
| 2015/0116950 A1 | 4/2015 | Yoo et al. | |
| 2015/0302974 A1* | 10/2015 | Zhao | H01F 41/046 336/200 |
| 2016/0086723 A1 | 3/2016 | Su et al. | |
| 2016/0155559 A1 | 6/2016 | Chiu et al. | |
| 2017/0229963 A1 | 8/2017 | Zeng et al. | |

FOREIGN PATENT DOCUMENTS

| | | |
|---|---|---|
| CN | 103871987 A | 6/2014 |
| CN | 103943306 A | 7/2014 |
| CN | 104756207 A | 7/2015 |
| CN | 105185554 A | 12/2015 |
| CN | 204884757 U | 12/2015 |
| EP | 0921542 A1 | 6/1999 |
| JP | H05109556 A | 4/1993 |
| JP | 2008017540 A | 1/2008 |
| JP | 2017028064 A | 2/2017 |
| WO | 2014093884 A1 | 6/2014 |
| WO | 2015129601 A1 | 9/2015 |

\* cited by examiner providing a first board and a magnetic component, wherein the first board comprises a first side, a second side and at least one conductive component, the first side and the second side are opposite to each other, and the at least one conductive component is disposed between the first side and the second side, wherein the magnetic component is disposed between the first side and the second side of the first board and comprises at least one magnetic core and at least one winding, and the at least one winding comprises a first conductive terminal and a second conductive terminal led out on the first side and the second side of the first board, respectively — S1 providing a second board, wherein the second board is disposed on the first board and comprises a third side and a fourth side, the third side and the fourth side are opposite to each other, and the fourth side faces the first side — S2 providing at least one power device — S3 disposing the at least one power device on the third side of the second board, wherein the at least one power device is electrically connected to the first board through the second board — S4

FIG. 12

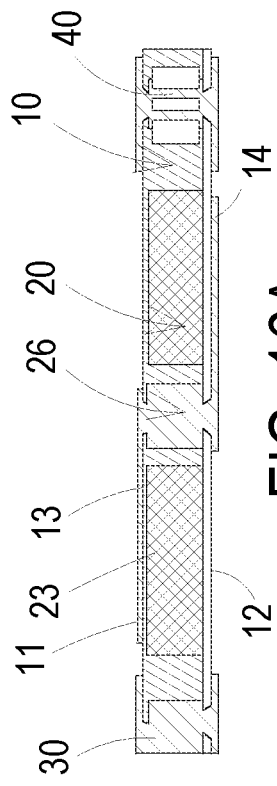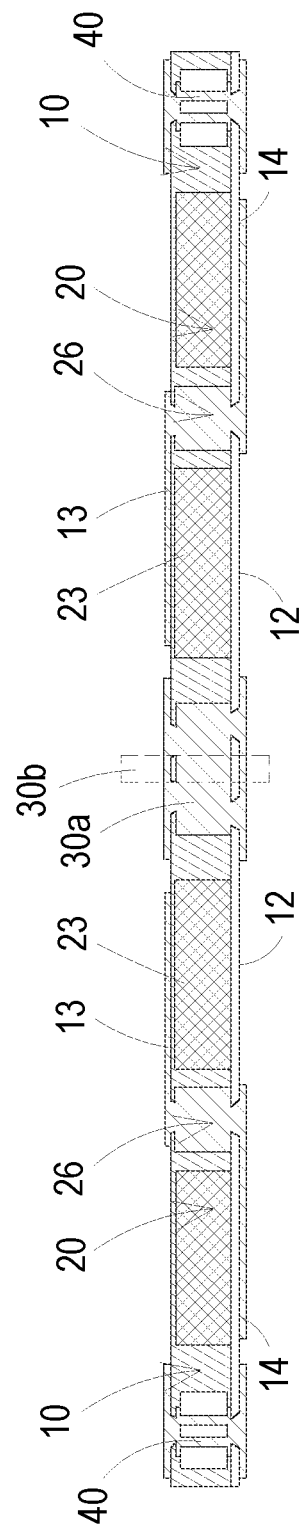

POWER MODULE AND MANUFACTURING METHOD THEREOF

CROSS-REFERENCE TO RELATED APPLICATION

This application claims priority to China Patent Application No. 201910402768.4, filed on May 15, 2019. This application is a continuation-in-part application of U.S. application Ser. No. 16/130,850 filed on Sep. 13, 2018 and entitled "POWER MODULE AND MANUFACTURING METHOD THEREOF", which is a continuation-in-part of U.S. application Ser. No. 15/158,016 filed on May 18, 2016 and entitled "MAGNETIC ASSEMBLY". The entire contents of the above-mentioned patent applications are incorporated herein by reference for all purposes.

FIELD OF THE INVENTION

The present disclosure relates to a power module, and more particularly to an optimized power module and a manufacturing method thereof.

BACKGROUND OF THE INVENTION

With the increasing requests of human intelligent life, the increasing requirements of developing intelligent products, and the growing of Internet of Things (IoT), the requirements of data transmission and processing are increasing day by day. In a centralized data processing center, servers are key elements and have motherboards including CPU, chipsets, and memories, such as digital chips for data processing with power supplies and necessary peripheral elements. For increasing the processing capacity of a unit volume of servers, the number of digital chips and the density of integration are increased correspondingly. Consequently, the ratio of occupied space and power loss are increased. Therefore, the power supply (also called as onboard power due to that the power supply and the digital chips are disposed on the same motherboard) employed by the system for providing power to the digital chips is expected to have higher efficiency, higher power density and smaller occupied space, so as to facilitate the entire server and even the entire data center to save energy and minimize the occupied area.

Generally, the power with the low voltage and the large current is provided to the above digital chips. For reducing the influences of power loss and impedance of the output wire, power supplies capable of providing power to the digital chips are directly disposed on the motherboard and located as close as possible to the digital chips. Therefore, the power supply capable of providing power to the digital chips directly is called as point of the load (POL). The above-mentioned power supply has an input power provided from other power source. The typical POL has an input voltage about 12 volts. Furthermore, as the performance of various types of chips continues to increase, its power consumption also increases, and the point power supply is closer to the load, which brings higher requirements for cooling system.

On the other hand, for achieving the applications in a distributed data processing terminal, like smart phone, the constituent elements and the digital chips have to be integrated into a small space and keep working continuously. In addition, lower operating voltage is provided to the constituent elements and the digital chips. Generally, the lower operating voltage is provided by an energy storage device such as 3V to 5V battery. Therefore, the power supply tends to be requested with high efficiency and high power density.

Recently, since the switching power supplies can exhibit better conversion efficiency than the linear power supplies, the application of switching power supplies is also becoming more widespread. However, compared with the linear power supply, the circuit of the switching power supply is more complicated, and the magnetic components/capacitors are usually utilized as the energy storage/filtering function therein, so that it is not easy to achieve chip level integration.

At present, in a low-voltage DC/DC converter, a buck converter is usually employed to provide various output voltages ranged from 0 volt to 5 volts for the corresponding digital chips. FIG. 1 shows a circuit diagram of a typical buck converter. As shown in FIG. 1, the buck converter includes an input filter capacitor Cin, a main switch Q1, an auxiliary switch Q2, an inductor L and an output capacitor Co. The input filter capacitor Cin is electrically connected with a power source for receiving an input voltage Vin. The main switch Q1 includes one end connected to the input filter capacitor Cin and another end connected to the inductor L. The main switch Q1 performs a turn-on and turn-off operation to convert the power from the input to output and adjust the output voltage and the output current. Usually, the main switch Q1 is a metal oxide semiconductor field effect transistor (MOSFET). The auxiliary switch Q2 includes one end connected to one node of the main switch Q1 and the inductor L and another end connected to the ground. The auxiliary switch Q2 provides a path for the inductor L to release energy in a free wheel mode, wherein the auxiliary switch Q2 can be a diode. In order to reduce the loss, the auxiliary switch Q2 can also be a metal oxide semiconductor field effect transistor (MOSFET) and perform synchronous rectification control to achieve near-ideal diode function. The inductor L includes one end connected to the node of the main switch Q1 and the auxiliary switch Q2, and another end connected to the output capacitor Co. The inductor L and the output capacitor Co cooperatively filter the output voltage with square wave formed by the alternative switching operation of the main switch Q1 and the auxiliary switch Q2 into an average value, that is, a direct current output with an output voltage Vout. The output capacitor Co is configured to absorb the current ripple outputted from the inductor L such that the voltage ripple of the output voltage Vout is less than a required value. The output voltage Vout of the buck converter can be provided to a load RL, i.e. the digital chip or a CPU.

In order to further improve the efficiency and power density of the power converter, the prior art is individually optimized from the perspectives of, for example, a magnetic component, a bare power device, and a capacitor component. However, with the advancement of technology, the independent optimization of a single component has gradually reached the limit. It is impossible to further achieve high efficiency, high power density and high heat dissipation capacity by optimizing a single component individually.

Therefore, there is a need of providing a power module and a manufacturing method thereof in order to achieve the purposes of high efficiency, high power density and high heat dissipation capacity, and overcome the drawbacks encountered by the prior art.

SUMMARY OF THE INVENTION

An object of the present disclosure is to provide a power module and a manufacturing method thereof. With a magnetic component and a conductive component embedded in a board and connected between the wiring layers on two sides of the board, the flexibility of arrangements of the power device and other electronic devices can be enhanced, and the connection of the magnetic component and the power device can be optimized and integrated. Consequently, a power module with high efficiency, high power density and high heat dissipation capacity is achieved. The occupied space of the power module relative to the system motherboard can be decreased, so that the product with the power module is more competitive.

Another object of the present disclosure is to provide a power module and a manufacturing method thereof. The optimized and integrated power module can be varied to meet different application requirements, increase the design variability and further optimize the circuit characteristics of the power module. Meanwhile, more functions are integrated into the power module.

A further object of the present disclosure is to provide a power module and a manufacturing method thereof. With the copper blocks, the conductive vias, the leading frames or the circuit board combined with the magnetic component and integrated between the wiring layers on two sides of the board, it simplifies the art of embedding the magnetic component and the conductive components within the board, so as to improve the production efficiency, and facilitate to achieve the purposes of assembling the optimized power module and reducing the manufacturing cost thereof.

In accordance with an aspect of the present disclosure, a power module is provided. The power module includes a first board, a magnetic component, a second board and a power device. The first board includes a first side, a second side and at least one conductive component. The first side and the second side are opposite to each other, and the at least one conductive component is disposed between the first side and the second side. The magnetic component is disposed between the first side and the second side of the first board and includes at least one magnetic core and at least one winding. The at least one winding includes a first conductive terminal and a second conductive terminal led out on the first side and the second side of the first board, respectively. The second board is disposed on the first board and includes a third side and a fourth side. The third side and the fourth side are opposite to each other, and the fourth side faces the first side. The at least one power device is disposed on the third side of the second board and electrically connected to the first board through the second board.

In accordance with another aspect of the present disclosure, a manufacturing method of a power module is provided. The manufacturing method includes steps of: (a) providing a first board and a magnetic component, wherein the first board includes a first side, a second side and at least one conductive component, the first side and the second side are opposite to each other, and the at least one conductive component is disposed between the first side and the second side, wherein the magnetic component is disposed between the first side and the second side of the first board and includes at least one magnetic core and at least one winding, and the at least one winding includes a first conductive terminal and a second conductive terminal led out on the first side and the second side of the first board, respectively; (b) providing a second board, wherein the second board is disposed on the first board and includes a third side and a fourth side, the third side and the fourth side are opposite to each other, and the fourth side faces the first side; (c) providing at least one power device; and (d) disposing the at least one power device on the third side of the second board, wherein the at least one power device is electrically connected to the first board through the second board.

The above contents of the present disclosure will become more readily apparent to those ordinarily skilled in the art after reviewing the following detailed description and accompanying drawings, in which:

BRIEF DESCRIPTION OF THE DRAWINGS

FIG. 12 is a flow chart illustrating a manufacturing method of a power module according to an embodiment of the present disclosure;

FIGS. 16A to 16D show a manufacturing process of the first board combined with other components according to a fourth embodiment of the present disclosure;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 2:
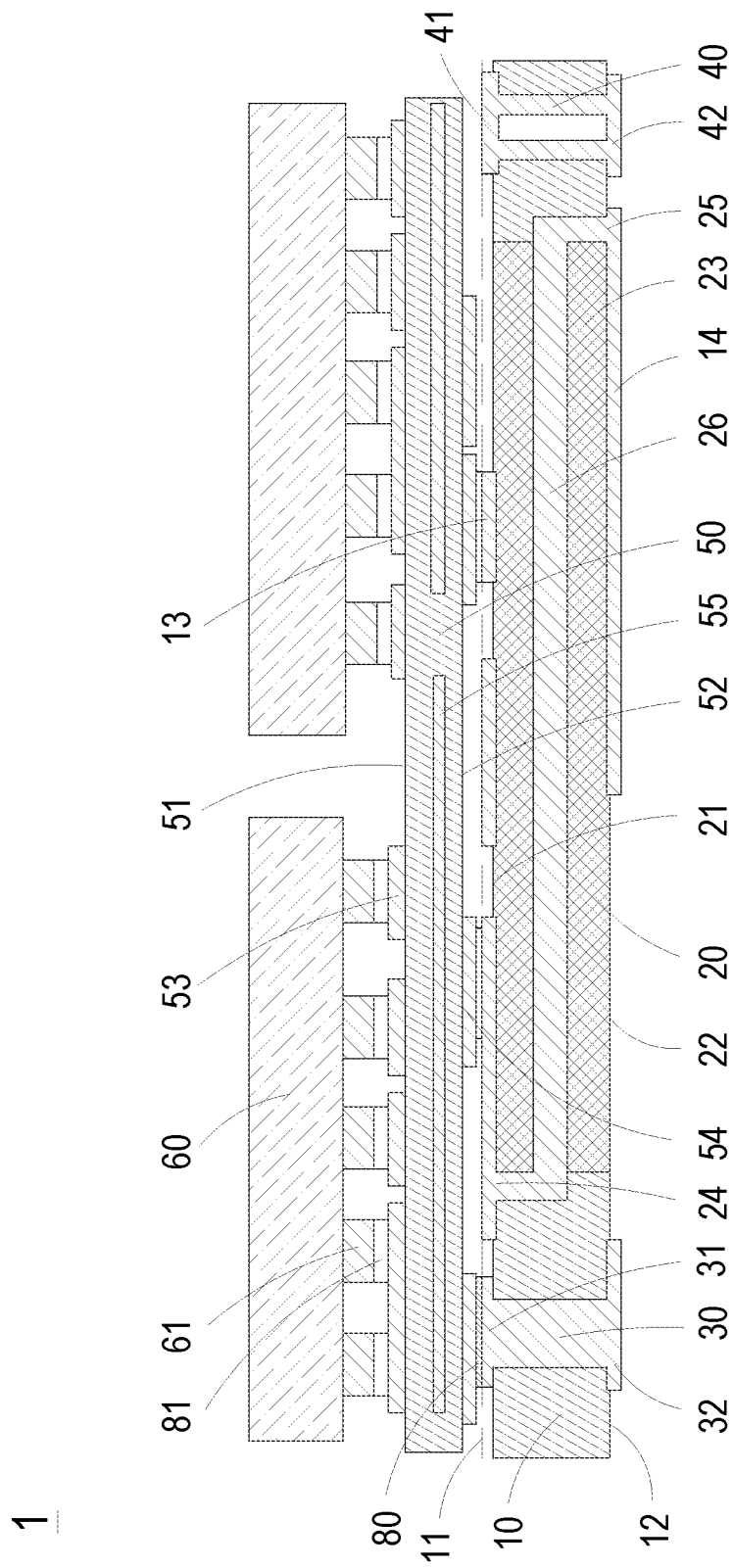
FIG. 2 is a schematic cross-sectional view illustrating a power module according to a first embodiment of the present disclosure.

FIG. 2 is a schematic cross-sectional view illustrating a power module according to a first embodiment of the present disclosure. The power module 1 includes a first board 10, a magnetic component 20, a second board 50 and at least one power device 60. The first board 10 includes a first side 11, a second side 12, a first conductive component 30 and a second conductive component 40. The first side 11 and the second side 12 are opposite to each other. Preferably but not exclusively, the first side 11 is the highest surface of the first board 10, and the second side 12 is the lowest surface of the first board 10. In the embodiment, both of the first conductive component 30 and the second conductive component 40 are disposed between the first side 11 and the second side 12. The magnetic component 20 is disposed between the first side 11 and the second side 12 of the first board 10 and includes at least one magnetic core 23 and at least one winding 26. Preferably but not exclusively, the top surface 21 of the magnetic core 23 is spatially corresponding to the first side 11 of the first board 10, and the bottom surface 22 of the magnetic core 23 is spatially corresponding to the second side 12 of the first board 10. In the embodiment, the at least one winding 26 includes a first conductive terminal 24 and a second conductive terminal 25, which are led out on the first side 11 and the second side 12 of the first board 10, respectively. Namely, the first conductive terminal 24 and the second conductive terminal 25 of the winding 26 are led out on the first side 11 and the second side 12 of the first board 10, respectively. Different from the winding 26 having two terminals led out on the same side (for example the first side 11) of the first board 10, in the embodiment, at least the first conductive component 30 can be omitted, and it is further beneficial to reduce the equivalent impedance of the magnetic component 20 and reduce the waste of resources of the second board 50. The structure of the magnetic component 20 can be adjustable according to the practical requirements. Preferably but not exclusively, the magnetic component 20 is an LTCC inductor, a press-fit power inductor or an assembled inductor. Furthermore, for specific applications such as power modules for CPU or voltage regulation modules (VRMs), the dynamic performance of the power supply is increasingly demanding, and the magnetic component 20 can be a reverse-coupled inductor. Moreover, the first end 31 of the first conductive component 30 is led out on the first side 11 of the first board 10, and the second end 32 of the first conductive component 30 is led out on the second side 12 of the first board 10. The first end 41 of the second conductive component 40 is led out on the first side 11 of the first board 10, and the second end 42 of the second conductive component 40 is led out on the second side 12 of the first board 10. Preferably but not exclusively, the first conductive component 30 is a copper block and the second conductive component 40 is a conductive via. In other embodiments, the first conductive component 30 and the second conductive component 40 can be copper blocks, conductive vias, leading frames or circuit boards. In the embodiment, the first board 10 further includes a first wiring layer 13 and a second wiring layer 14. The first wiring layer 13 and the second wiring layer 14 are disposed on the first side 11 and the second side 12, respectively. The first conductive component 30 are electrically connected between the first wiring layer 13 and the second wiring layer 14, and the second conductive component 40 are electrically connected between the first wiring layer 13 and the second wiring layer 14, respectively. The first conductive terminal 24 are electrically connected between the first wiring layer 13 and the second wiring layer 14, and the second conductive terminal 25 of the at least one winding 26 are electrically connected between the first wiring layer 13 and the second wiring layer 14, respectively. In the embodiment, at least one dielectric material (not shown) is formed among the first wiring layer 13, the second wiring layer 14 and the magnetic core 23 of the magnetic component 20. The at least one dielectric material is beneficial to achieve the purpose of insulating and protecting the surface of the magnetic core 23, and increasing the bonding force among the magnetic core 23 and the first wiring layer 13 and the second wiring layer 14. In the embodiment, the top surface 21 of the magnetic component 20 embedded in the first board 10 is directly exposed on the first side 11 of the first board 10, and the bottom surface 22 of the magnetic component 20 embedded in the first board 10 is directly exposed on the second side 12 of the first board 10.

In the embodiment, the second board 50 is disposed on the first board 10 and includes a third side 51 and a fourth side 52. The third side 51 and the fourth side 52 are opposite to each other, and the fourth side 52 faces the first side 11. The at least one power device 60 is disposed on the third side 51 of the second board 50 and electrically connected to the first board 10 through the second board 50. The second board 50 includes a third wiring layer 53 and a fourth wiring layer 54. The third wiring layer 53 is disposed on the third side 51, and the fourth wiring layer 54 is disposed on the fourth side 52, respectively. And the third wiring layer 53 and the fourth wiring layer 54 are electrically connected to each other. In another embodiment, the second board 50 further includes a fifth wiring layer 55. The fifth wiring layer 55 is disposed between the third side 51 and the fourth side 52 and at least electrically connected to the third wiring 53 or the fourth wiring layer 54. In addition, the fourth wiring layer 54 on the fourth side 52 of the second board 50 and the first wiring layer 13 on the first side 11 of the first board 10 are connected with each other by for example but not limited to a solder 80, or other connection meanings, such as a conductive adhesive or a low-temperature sintered material (low-temperature sintered silver). Preferably but not exclusively, the power device 60 includes a conductive terminal 61, which is electrically connected to the third wiring layer 53 on the third side 51 of the second board 50 by a solder 81 or other connection meanings. In the embodiment, the power device 60 can be for example a Si MOSFET, GaN switching components, SiC MOSFET and so on. The power device 60 can be further integrated with function of driving and control. In an embodiment, the power device 60 can be a single semiconductor switching device, a half bridge circuit or a plurality of half bridge circuits. The present disclosure is not limited thereto. Furthermore, the power device 60 is in the form of a flip chip, a quad flat no-lead package (QFN package) having an exposed surface, or a QFN package having an exposed surface thermally coupled with the heat sink. The forms of packages facilitate the power device 60 to dissipate the heat to the heat sink (not shown) disposed on the surface of the power device 60 or to the environment directly. In case that the power device 60 is packaged in form of the flip chip, an under-fill material is disposed under the power device 60 to enhance the structural stability. Furthermore, when the power device 60 is packaged in form of the flip chip, a heat dissipation sheet, usually made of a metal material, is attached through a thermal interface material. It is beneficial to improve the thermal performance and protect the chip mechanically at the same time. In an embodiment, when the power device 60 is packaged in form of the flip chip, a height-limit block is disposed on the second board 50. The height of the height-limit block is not less than the thickness of the chip. In that, it prevents from generating an excessive pressure to damage the chip during mounting an external heat sink. Thus, the magnetic component 20, the first conductive component 30 and the second conductive component 40 are embedded in the first board 10 and electrically connected between the first wiring layer 13 on the first side 11 and the second wiring layer 14 on the second side 12 of the first board 10, and it benefits to enhance the flexibility of the arrangement of the power device 60 and optimize and integrate the connection of the magnetic component 20 and the power device 60. Consequently, the power module 1 with high efficiency, high power density and high heat dissipation capacity is achieved. The occupied space of the power module 1 on the system motherboard can be decreased and the manufacture is simplified at the same time, so that the product with the power module 1 is more competitive.

Figure 1:
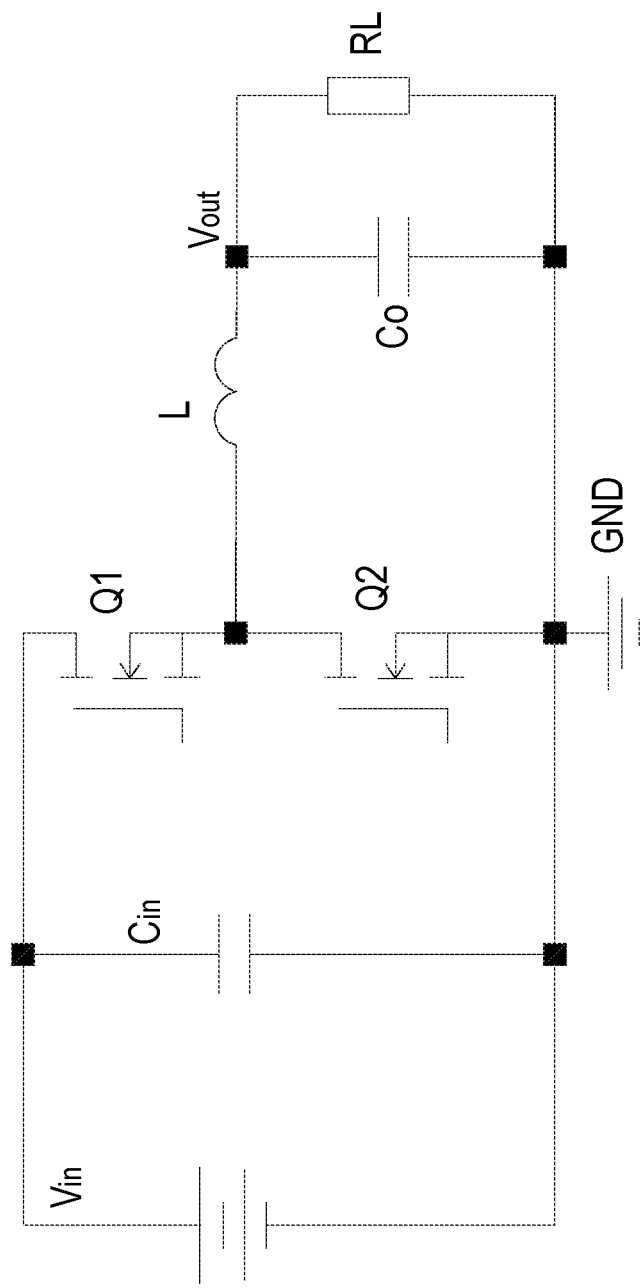
FIG. 1 shows a circuit diagram of a typical buck converter.

Please refer to FIGS. 1 and 2 again. In the embodiment, the power device 60 can include for example two switching devices, which are a main switch Q1 and an auxiliary switch Q2. The node between the main switch Q1 and the auxiliary switch Q2 are connected with one end of the inductor L through the metallization layer. Another end of the inductor L is an output Vout. Other terminals, such as Vin end, GND end and other driving control electrode of the power device 60 can be fan-outed through the first conductive component 30 and the second conductive component 40. Preferably but not exclusively, the GND end of the power device 60 is fan-outed to the second side 12 of the first board 10 through the first conductive component 30 in the shortest distance, so as to electrically connect to the system motherboard. It won't be redundantly described herein.

Figure 3:
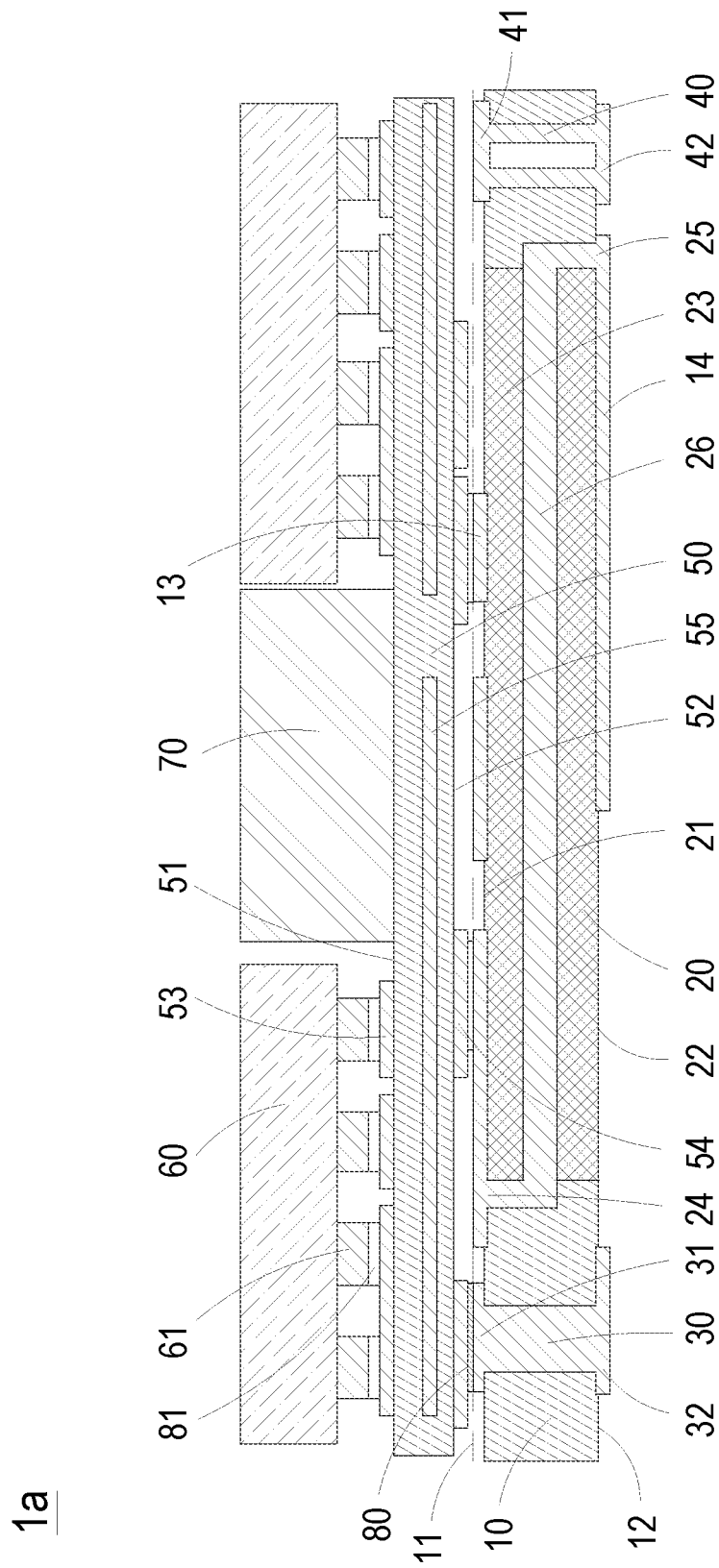
FIG. 3 is a schematic cross-sectional view illustrating a power module according to a second embodiment of the present disclosure.

FIG. 3 is a schematic cross-sectional view illustrating a power module according to a second embodiment of the present disclosure. In the embodiment, the structures, elements and functions of the power module 1a are similar to those of the power module 1 in FIG. 2, and are not redundantly described herein. In the embodiment, the power module 1a further includes at least one electronic device 70 disposed on the third wiring layer 53, which is disposed on the third side 51 of the second board 50. The pin of the at least one electronic device 70 is electrically connected to the third wiring layer 53 of the second board 50 through a solder (not shown). Preferably but not exclusively, the at least one electronic device 70 is adjacent to the power device 60, or disposed between two power devices 60. In an embodiment, a heat sink (not shown) is further integrally disposed on the power device 60 and the electronic device 70. However, it is not an essential feature to limit the present disclosure, and not redundantly described herein. The at least one electronic device 70 can be a capacitor, a resistor or a driver. In an embodiment, the electronic device 70 is the input filter capacitor Cin of FIG. 1. Since the input filter capacitor Cin is disposed nearby the main switch Q1 and the auxiliary switch Q2, the parasitic inductance of the loop can be reduced effectively, so as to improve the efficiency and electrical reliability of the power module 1a. Thus, the magnetic component 20, the first conductive component 30 and the second conductive component 40 are embedded in the first board 10 and electrically connected between the first wiring layer 13 on the first side 11 and the second wiring layer 14 on the second side 12 of the first board 10, and it benefits to enhance the flexibility of the arrangement of the power device 60 and the electronic device 70 and optimize and integrate the connection of the magnetic component 20, the power device 60 and the electronic device 70. Consequently, the power module 1a with high efficiency, high power density and high heat dissipation capacity is achieved. The occupied space of the power module 1a relative to the system motherboard can be decreased and the manufacture is simplified at the same time, so that the product with the power module 1a is more competitive.

Figure 4:
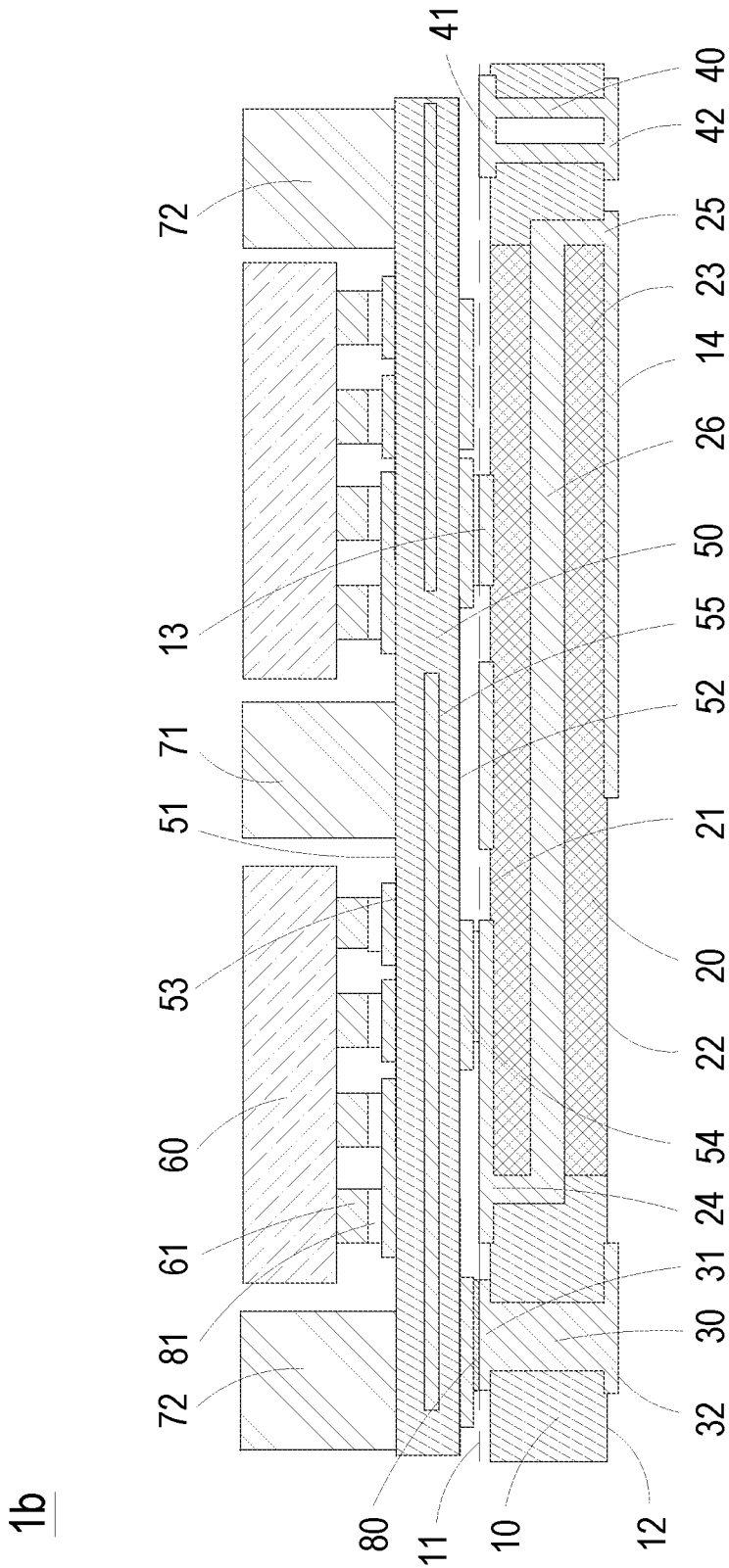
FIG. 4 is a schematic cross-sectional view illustrating a power module according to a third embodiment of the present disclosure.

FIG. 4 is a schematic cross-sectional view illustrating a power module according to a third embodiment of the present disclosure. In the embodiment, the structures, elements and functions of the power module 1b are similar to those of the power module 1a in FIG. 3, and are not redundantly described herein. In the embodiment, the power module 1b includes at least one first electronic device 71 and at least one second electronic device 72 disposed on the third wiring layer 53, which are disposed on the third side 51 of the second board 50. The leading pins of the first electronic device 71 and the second electronic device 72 are electrically connected to the third wiring layer 53 of the second board 50 through a solder (not shown), respectively. The first electronic device 71 is disposed between the two power devices 60. The second electronic device 72 is disposed nearby a margin region of the third side 51 of the second board 50. In the embodiment, the first electronic device 71 and the second electronic device 72 are the similar or different devices, which are one selected from the group consisting of a capacitor, a resistor and a driver. The present disclosure is not limited thereto. In an embodiment, the first electronic device 71 or the second electronic device 72 is the input filter capacitor Cin of FIG. 1. Since the input filter capacitor Cin is disposed nearby the main switch Q1 and the auxiliary switch Q2, the parasitic inductance of the loop can be reduced effectively, so as to improve the efficiency and electrical reliability of the power module 1b. In the embodiment, the arrangement of the first electronic device 71 and the second electronic device 72 can be adjustable according to the practical requirements. Thus, the power module 1b with high efficiency, high power density and high heat dissipation capacity is achieved. The occupied space of the power module 1b relative to the system motherboard can be decreased, so that the product with the power module 1b is more competitive.

Moreover, it is noted that the magnetic component 20, the first conductive component 30 and the second conductive component 40 are embedded in the first board 10 and electrically connected between the first wiring layer 13 on the first side 11 and the second wiring layer 14 on the second side 12 of the first board 10, and it benefits to enhance the flexibility of the arrangement of the power device 60, the first electronic device 71 and the second electronic device 72. The numbers of the first conductive component 30 and the second conductive component 40, the connection of the first wiring layer 13 and the second wiring layer 14 are adjustable and altered according to the practical requirements. In an embodiment, the first conductive component 30 or the second conductive component 40 can be omitted, and the first wiring layer 13 and the second wiring layer 14 are electrically connected with each other through one of the first conductive component 30 and the second conductive component 40 merely. The present disclosure is not limited thereto and not redundantly described herein.

Figure 5:
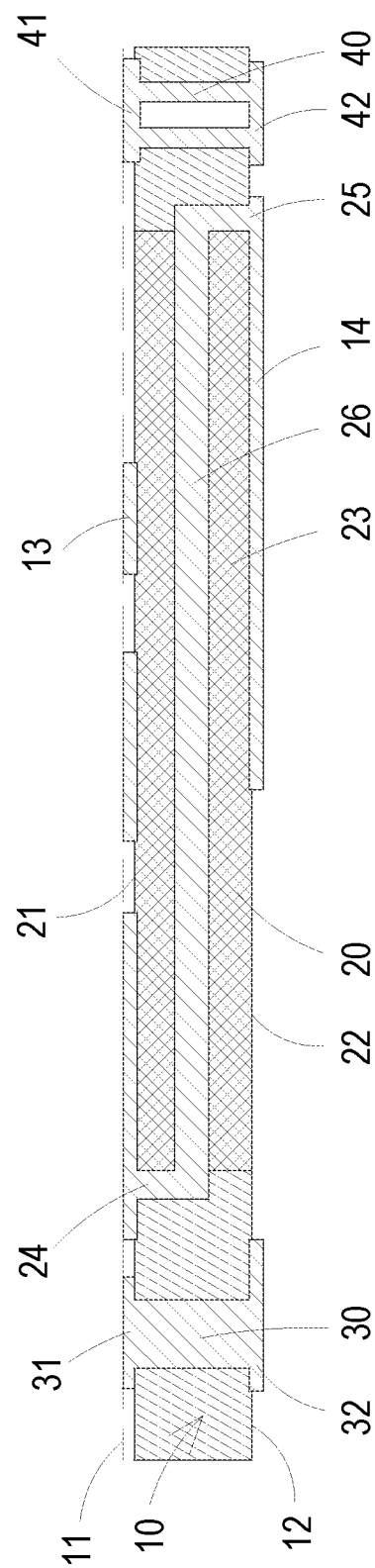
FIG. 5 is a schematic cross-sectional view illustrating a first exemplary structure of the first board combined with other components.

FIG. 5 is a schematic cross-sectional view illustrating a first exemplary structure of the first board combined with other components. In the embodiment, the first board 10 includes a first side 11, a second side 12, a first conductive component 30 and a second conductive component 40. The first side 11 and the second side 12 are opposite to each other. The first conductive component 30 and the second conductive component 40 are disposed between the first side 11 and the second side 12, respectively. The magnetic component 20 is disposed between the first side 11 and the second side 12 of the first board 10 and includes at least one magnetic core 23 and at least one winding 26. Preferably but not exclusively, the top surface 21 of the magnetic core 23 is spatially corresponding to the first side 11 of the first board 10, and the bottom surface 22 of the magnetic core 23 is spatially corresponding to the second side 12 of the first board 10. In the embodiment, the at least one winding 26 includes a first conductive terminal 24 and a second conductive terminal 25, which are led out on the first side 11 and the second side 12 of the first board 10, respectively. The structure of the magnetic component 20 can be adjustable according to the practical requirements. Preferably but not exclusively, the magnetic component 20 is an LTCC inductor, a press-fit power inductor or an assembled inductor. Furthermore, for specific applications such as power modules for CPU or voltage regulation modules (VRMs), the dynamic performance of the power supply is increasingly demanding, and the magnetic component 20 can be a reverse-coupled inductor. Moreover, the first end 31 of the first conductive component 30 is led out on the first side 11 of the first board 10, and the second end 32 of the first conductive component 30 is led out on the second side 12 of the first board 10. The first end 41 of the second conductive component 40 is led out on the first side 11 of the first board 10, and the second end 42 of the second conductive component 40 is led out on the second side 12 of the first board 10. In the embodiment, the first board 10 further includes a first wiring layer 13 and a second wiring layer 14. The first wiring layer 13 and the second wiring layer 14 are disposed on the first side 11 and the second side 12, respectively. The first conductive component 30 and the second conductive component 40 are electrically connected between the first wiring layer 13 and the second wiring layer 14, respectively. The first conductive terminal 24 and the second conductive terminal 25 of the at least one winding 26 are electrically connected between the first wiring layer 13 and the second wiring layer 14, respectively. With the magnetic component 20, the first conductive component 30 and the second conductive component 40 embedded in the first board 10 and electrically connected between the first wiring layer 13 on the first side 11 and the second wiring layer 14 on the second side 12 of the first board 10, it benefits to enhance the flexibility of the arrangement of the power device 60 and the electronic device 70. In the embodiment, at least one dielectric material (not shown) is formed between any two of the first wiring layer 13, the second wiring layer 14 and the magnetic core 23 of the magnetic component 20. The at least one dielectric material is beneficial to achieve the purpose of insulating and protecting the surface of the magnetic core 23, and increasing the bonding force among the magnetic core 23 and the first wiring layer 13 and the second wiring layer 14.

Figure 6:
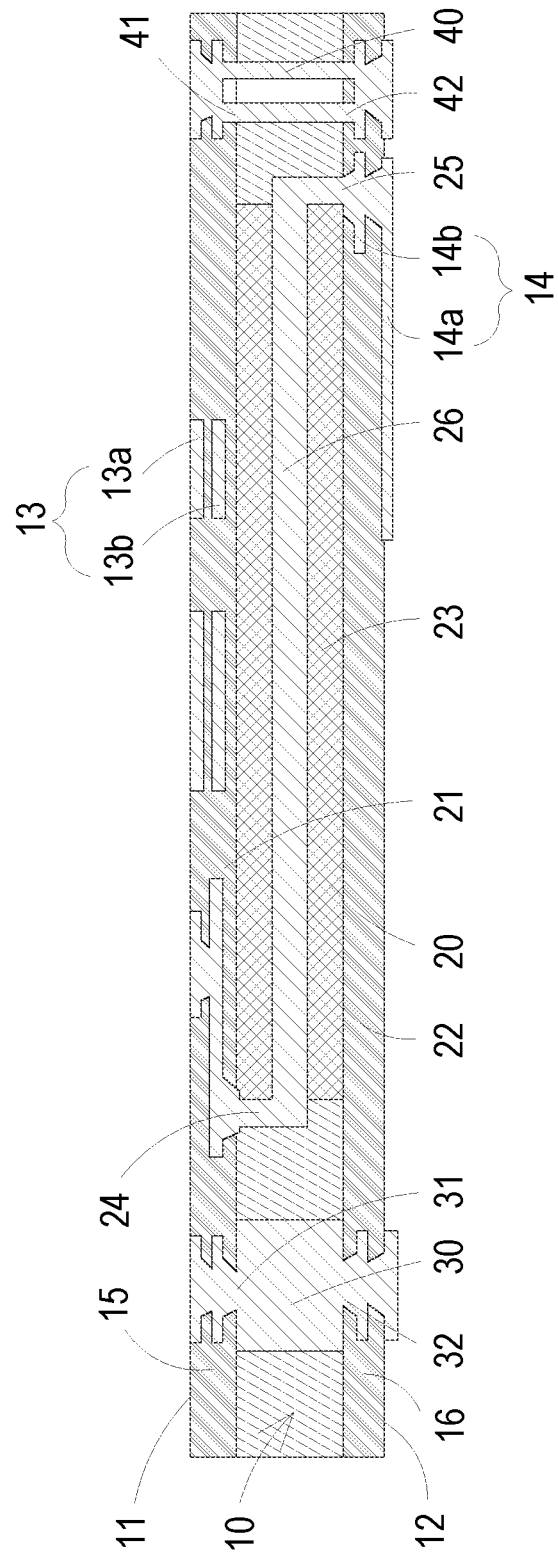
FIG. 6 is a schematic cross-sectional view illustrating a second exemplary structure of the first board.

FIG. 6 is a schematic cross-sectional view illustrating a second exemplary structure of the first board. In the embodiment, the structures, elements and functions of the first board 10 are similar to those of the first board 10 in FIG. 5 and are not redundantly described herein. In the embodiment, the first board 10 further includes a first insulation body 15 and a second insulation body 16 disposed on the first side 11 and the second side 12, respectively. The first wiring layer 13 and the second wiring layer 14 are disposed on the first insulation body 15 and the second insulation body 16, respectively. Preferably but not exclusively, the first wiring layer 13 and the second wiring layer 14 can be a multilayer-wiring layer. In the embodiment, the first wiring layer 13 includes a surface wiring layer 13a and an inner wiring layer 13b. The second wiring layer 14 includes a surface wiring layer 14a and an inner wiring layer 14b. Certainly, the present disclosure is not limited thereto. In addition, the magnetic component 20 is disposed between the first insulation body 15 and the second insulation body 16, and the first conductive terminal 24 and the second conductive terminal 25 of the winding 26 are electrically connected to the first wiring layer 13 and the second wiring layer 14, respectively. Namely, the first conductive terminal 24 and the second conductive terminal 25 of the winding 26 are led out on the first side 11 and the second side 12 of the first board 10, respectively. In that, the magnetic component 20, the first conductive component 30 and the second conductive component 40 are embedded in the first board 10 and electrically connected between the first wiring layer 13 on the first side 11 and the second wiring layer 14 on the second side 12 of the first board 10, and it benefits to enhance the flexibility of the arrangement of the power device 60 and the electronic device 70. Notably, in case of manufacturing the first board 10 in different methods, the first insulation body 15 and the second insulation body 16 can include a plurality of insulation material layers, the interfaces between the plurality of insulation material layers are adjustable, but not redundantly described hereafter. In an embodiment, at least one of the first insulation body 15 and the second insulation body 16 includes a flowable insulation material, which forms a final insulation material layer during lamination.

Figure 7:
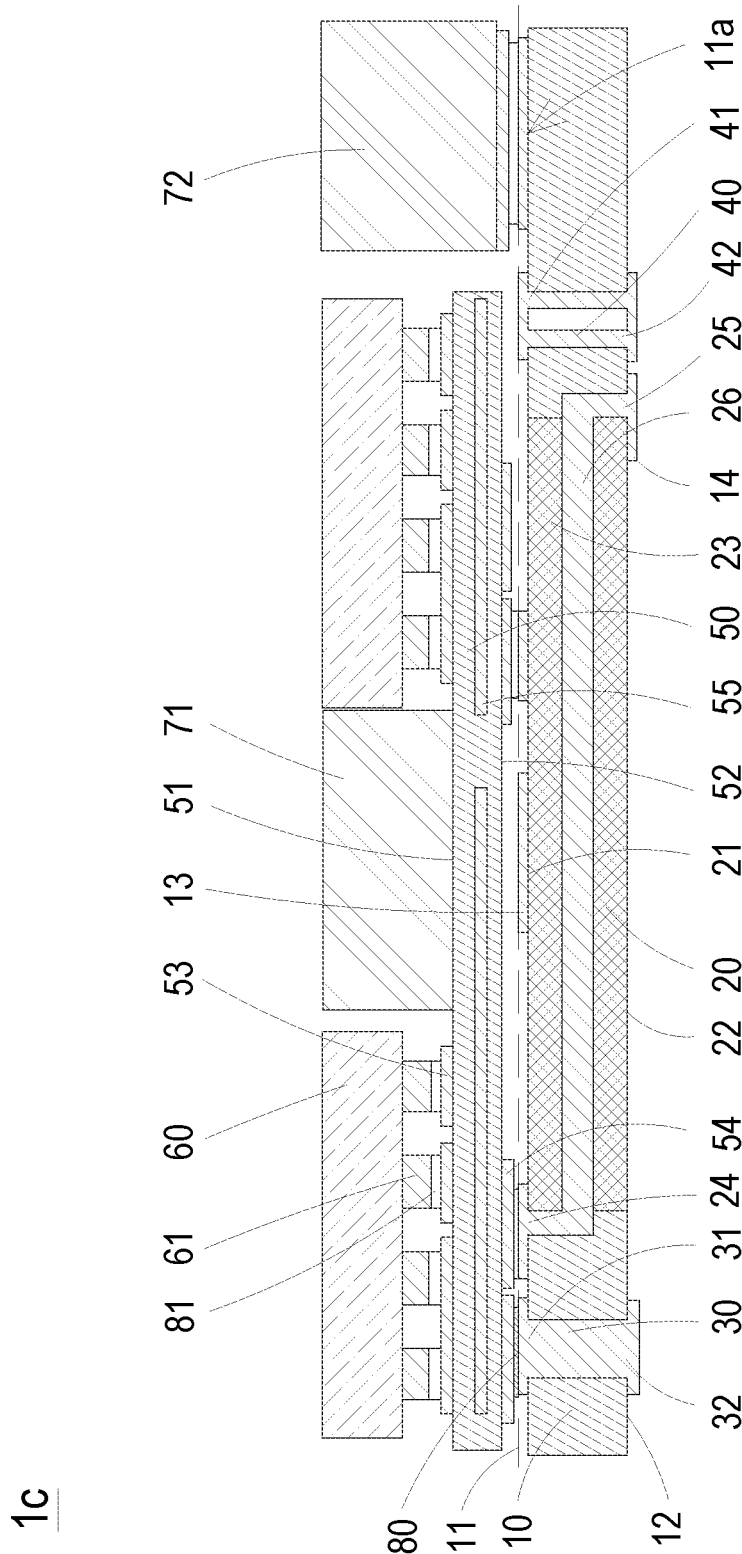
FIG. 7 is a schematic cross-sectional view illustrating a power module according to a fourth embodiment of the present disclosure.

FIG. 7 is a schematic cross-sectional view illustrating a power module according to a fourth embodiment of the present disclosure. In the embodiment, the structures, elements and functions of the power module 1c are similar to those of the power module 1a in FIG. 3, and are not redundantly described herein. In the embodiment, the power module 1c includes at least one first electronic device 71 and at least one second electronic device 72 disposed on the second board 50 and the first board 10, respectively. Meanwhile, the first electronic device 71 is disposed on the third wiring layer 53, which are disposed on the third side 51 of the second board 50. The leading pin of the first electronic device 71 and the third wiring layer 53 on the third side 51 of the second board 50 are connected with each other through a solder (not shown). Moreover, the first electronic device 71 is disposed between the two power devices 60. In the embodiment, the second board 50 exposes at least one margin region 11a of the first side 11 of the first board 10. Namely, in the margin region 11a, the first board 10 and the second board 50 are not overlapped in the vertical direction. The second electronic device 72 is disposed on the at least one margin region 11a of the first side 11 of the first board 10. Furthermore, the first electronic device 71 or the second electronic device 72 can be the input filter capacitor Cin of FIG. 1. Preferably but not exclusively, the first electronic device 71 is a capacitor having a thinner thickness and good high frequency characteristics, and is disposed close to the main switch Q1 and the auxiliary switch Q2, to reduce the parasitic inductance of the loop. Preferably but not exclusively, the second electronic device 72 is a capacitor having a thicker thickness and a large capacity, to enhance the efficiency and electrical reliability of the power module 1c effectively. Thus, with the magnetic component 20, the first conductive component 30 and the second conductive component 40 embedding in the first board 10, it benefits to optimize and integrate the connection of the magnetic component 20, the power device 60, the first electronic device 71 and the second electronic device 72. Consequently, the power module 1c with high efficiency, high power density and high heat dissipation capacity is achieved. The occupied space of the power module 1c relative to the system motherboard can be decreased, so that the product with the power module 1c is more competitive.

Figure 8:
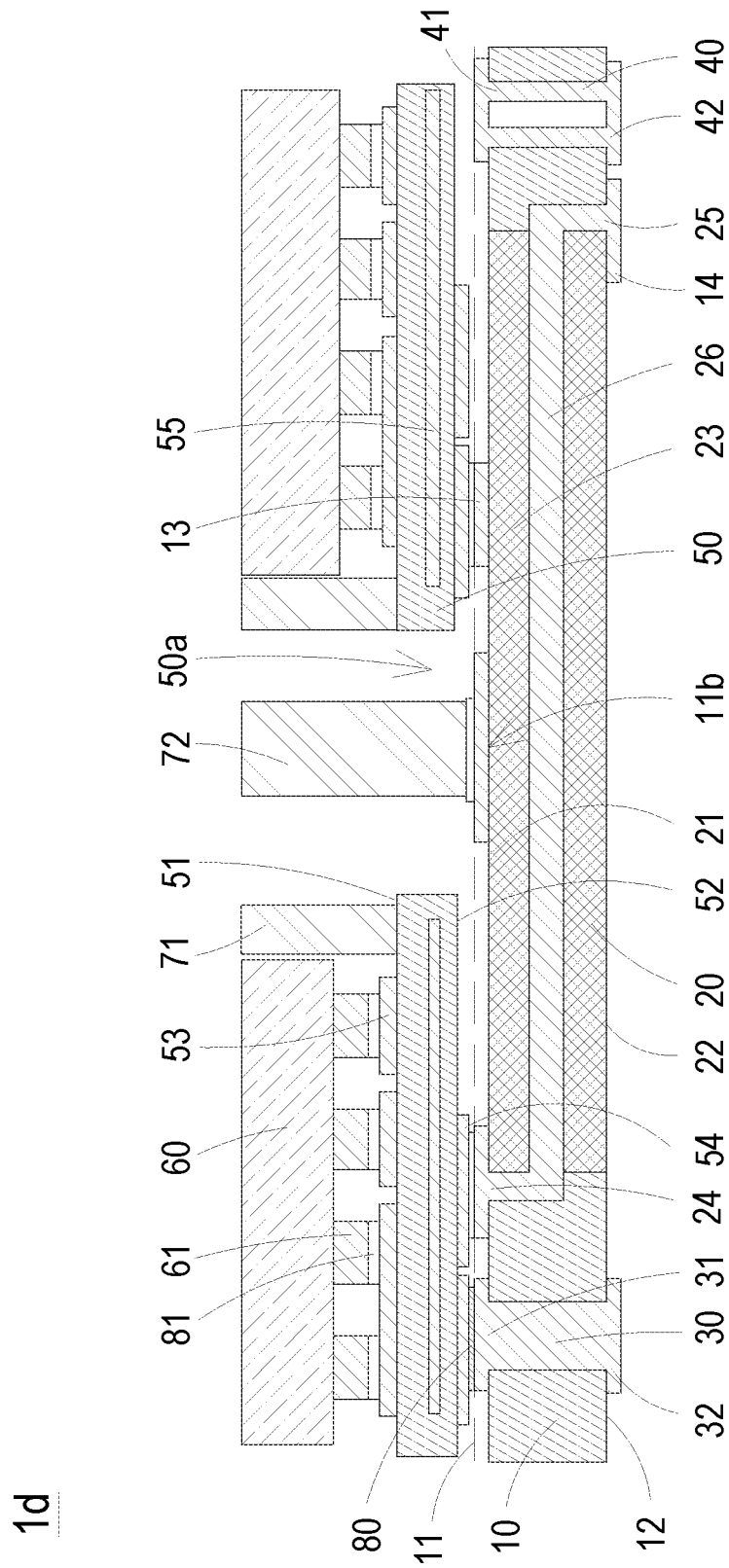
FIG. 8 is a schematic cross-sectional view illustrating a power module according to a fifth embodiment of the present disclosure.

FIG. 8 is a schematic cross-sectional view illustrating a power module according to a fifth embodiment of the present disclosure. In the embodiment, the structures, elements and functions of the power module 1d are similar to those of the power module 1a in FIG. 3, and are not redundantly described herein. In the embodiment, the power module 1d includes at least one first electronic device 71 and at least one second electronic device 72 disposed on the second board 50 and the first board 10, respectively. Meanwhile, the first electronic device 71 is disposed on the third wiring layer 53, which are disposed on the third side 51 of the second board 50. The leading pin of the first electronic device 71 and the third wiring layer 53 on the third side 51 of the second board 50 are connected with each other through a solder (not shown). The first electronic device 71 is adjacent to the power device 60. In the embodiment, the second board 50 includes at least one accommodation opening 50a, so the second board 50 exposes at least one partial region 11b of the first side 11 of the first board 10. Namely, in the partial region 11b, the first board 10 and the second board 50 are not overlapped in the vertical direction. The second electronic device 72 is received within the accommodation opening 50a, and disposed on the at least one partial region 11b of the first side 11. Furthermore, the first electronic device 71 or the second electronic device 72 can be the input filter capacitor Cin of FIG. 1. Preferably but not exclusively, the first electronic device 71 is a capacitor having a thinner thickness and good high frequency characteristics, and is disposed close to the main switch Q1 and the auxiliary switch Q2, to reduce the parasitic inductance of the loop. Preferably but not exclusively, the second electronic device 72 is a capacitor having a thicker thickness and a large capacity, to enhance the efficiency and electrical reliability of the power module 1d effectively. Thus, with the magnetic component 20, the first conductive component 30 and the second conductive component 40 embedding in the first board 10, it benefits to optimize and integrate the connection of the magnetic component 20, the power device 60, the first electronic device 71 and the second electronic device 72. Consequently, the power module 1d with high efficiency, high power density and high heat dissipation capacity is achieved. The occupied space of the power module 1d relative to the system motherboard can be decreased, so that the product with the power module 1d is more competitive.

Figure 9:
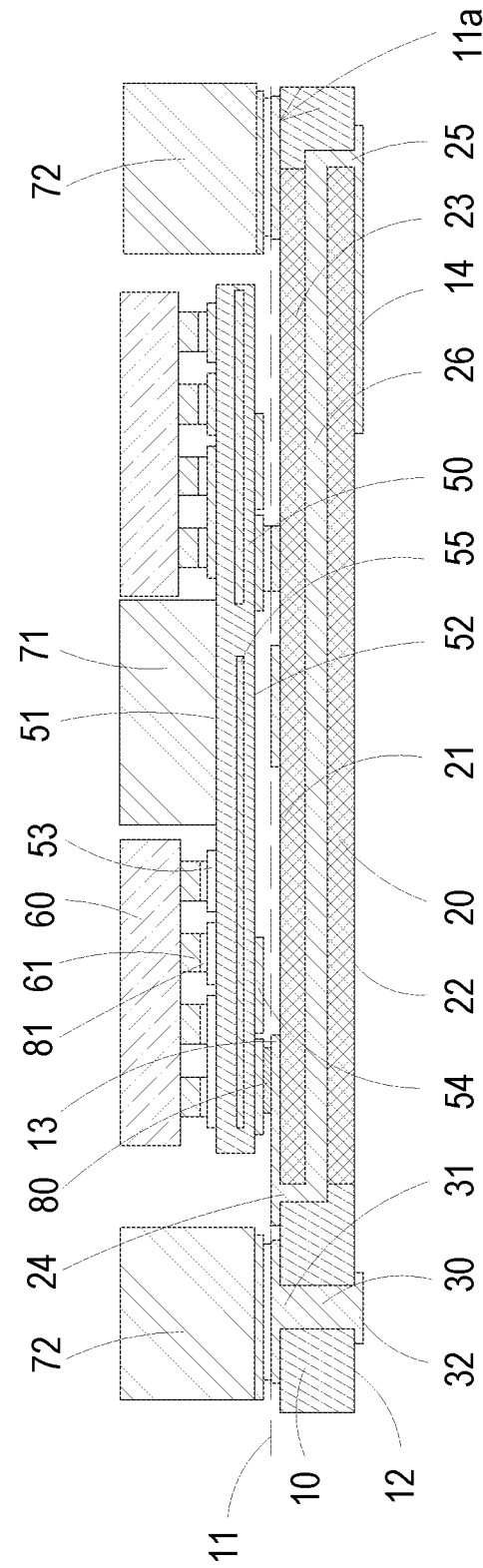
FIG. 9 is a schematic cross-sectional view illustrating a power module according to a sixth embodiment of the present disclosure.

FIG. 9 is a schematic cross-sectional view illustrating a power module according to a sixth embodiment of the present disclosure. In the embodiment, the structures, elements and functions of the power module 1e are similar to those of the power module 1a in FIG. 3, and are not redundantly described herein. In the embodiment, the power module 1e includes at least one first electronic device 71 and at least one second electronic device 72 disposed on the second board 50 and the first board 10, respectively. Furthermore, the power module 1e includes the first conductive component 30 embedded in the first board 10. Meanwhile, the first electronic device 71 is disposed on the third wiring layer 53, which are disposed on the third side 51 of the second board 50. The leading pin of the first electronic device 71 and the third wiring layer 53 on the third side 51 of the second board 50 are connected with each other through a solder (not shown). Moreover, the first electronic device 71 is disposed between the two power devices 60. In the embodiment, the second board 50 exposes at least one margin region 11a of the first side 11 of the first board 10. The second electronic device 72 is disposed on the at least one margin region 11a of the first side 11 of the first board 10, and electrically connected to the second side 12 of the first board 10 through the first conductive component 30 directly. Furthermore, the first electronic device 71 or the second electronic device 72 can be the input filter capacitor Cin of FIG. 1. Preferably but not exclusively, the first electronic device 71 is a capacitor having a thinner thickness and good high frequency characteristics, and is disposed close to the main switch Q1 and the auxiliary switch Q2, to reduce the parasitic inductance of the loop. Preferably but not exclusively, the second electronic device 72 is a capacitor having a thicker thickness and a large capacity, to enhance the efficiency and electrical reliability of the power module 1e effectively. Thus, with the magnetic component 20 and the first conductive component 30 embedding in the first board 10, it benefits to optimize and integrate the connection of the magnetic component 20, the power device 60, the first electronic device 71 and the second electronic device 72. Consequently, the power module 1e with high efficiency, high power density and high heat dissipation capacity is achieved. The occupied space of the power module 1e relative to the system motherboard can be decreased, so that the product with the power module 1e is more competitive.

Figure 10:
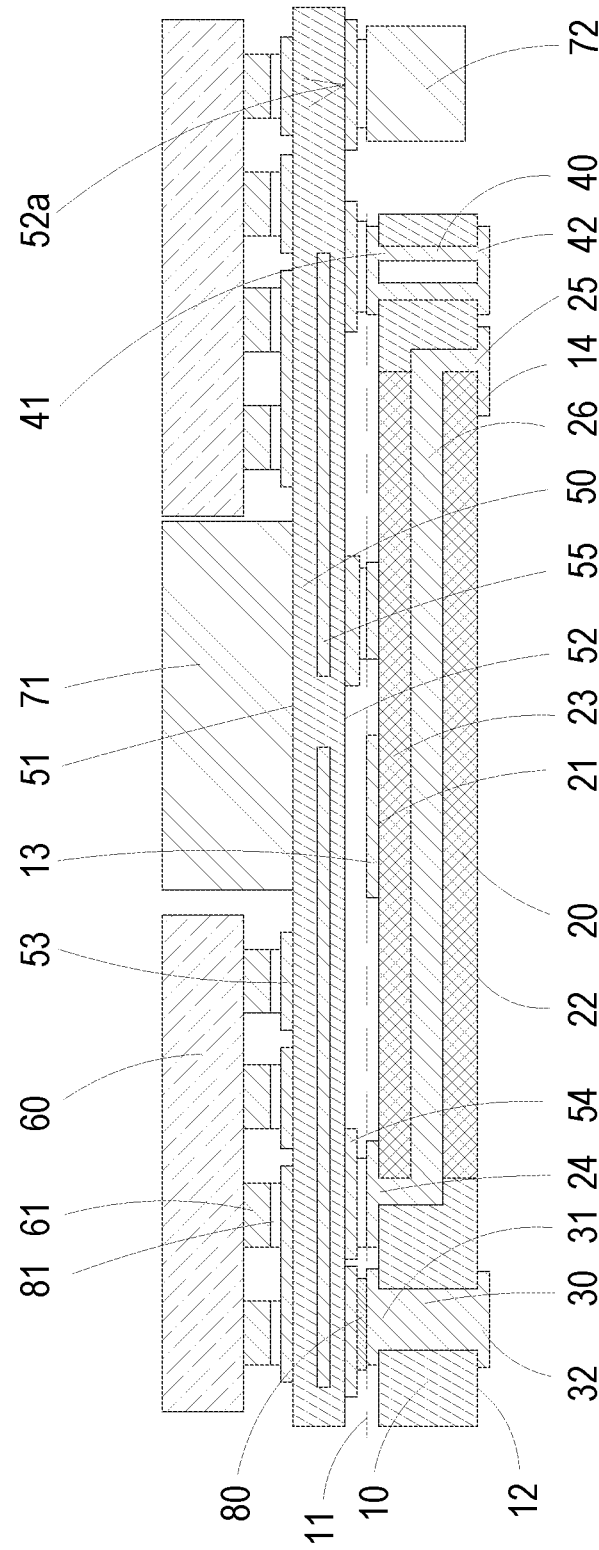
FIG. 10 is a schematic cross-sectional view illustrating a power module according to a seventh embodiment of the present disclosure.

FIG. 10 is a schematic cross-sectional view illustrating a power module according to a seventh embodiment of the present disclosure. In the embodiment, the structures, elements and functions of the power module if are similar to those of the power module 1a in FIG. 3, and are not redundantly described herein. In the embodiment, the power module if includes at least one first electronic device 71 and at least one second electronic device 72 disposed on the third side 51 and the fourth side 52 of the second board 50, respectively. Meanwhile, the first electronic device 71 is disposed on the third wiring layer 53, which are disposed on the third side 51 of the second board 50. The leading pin of the first electronic device 71 and the third wiring layer 53 on the third side 51 of the second board 50 are connected with each other through a solder (not shown). The first electronic device 71 is disposed between the two power devices 60. In the embodiment, the first board 10 disposes at least one margin region 11a of the fourth side 52 of the second board 50. The second electronic device 72 is disposed on the at least one margin region 52a of the fourth side 52 of the second board 50. Furthermore, the first electronic device 71 or the second electronic device 72 can be the input filter capacitor Cin of FIG. 1. Preferably but not exclusively, the first electronic device 71 is a capacitor having a thinner thickness and good high frequency characteristics, and is disposed close to the main switch Q1 and the auxiliary switch Q2, to reduce the parasitic inductance of the loop. Preferably but not exclusively, the second electronic device 72 is a capacitor having a thicker thickness and a large capacity, to enhance the efficiency and electrical reliability of the power module if effectively. Thus, with the magnetic component 20, the first conductive component 30 and the second conductive component 40 embedding in the first board 10, it benefits to optimize and integrate the connection of the magnetic component 20, the power device 60, the first electronic device 71 and the second electronic device 72. Consequently, the power module if with high efficiency, high power density and high heat dissipation capacity is achieved. The occupied space of the power module if relative to the system motherboard can be decreased, so that the product with the power module if is more competitive.

Figure 11:
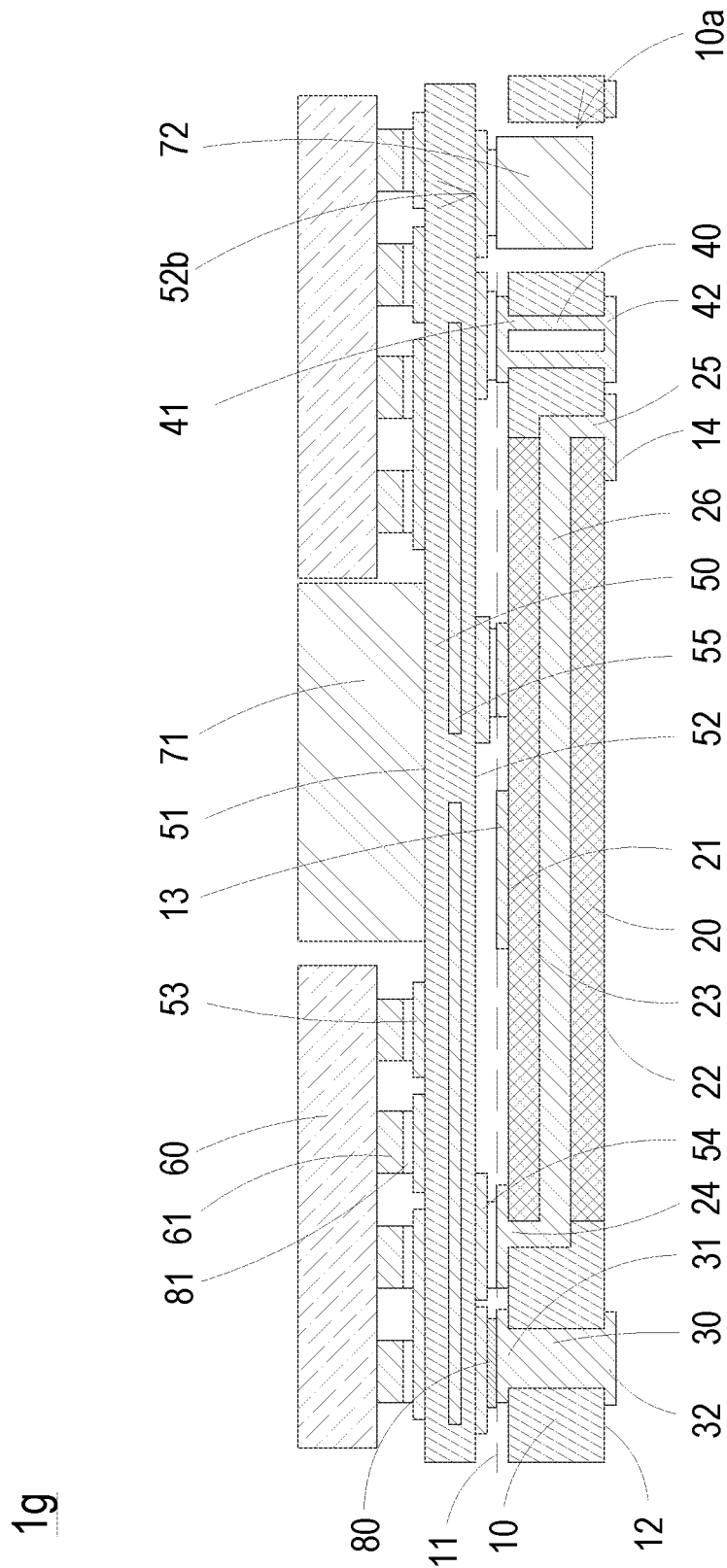
FIG. 11 is a schematic cross-sectional view illustrating a power module according to an eighth embodiment of the present disclosure.

FIG. 11 is a schematic cross-sectional view illustrating a power module according to an eighth embodiment of the present disclosure. In the embodiment, the structures, elements and functions of the power module 1g are similar to those of the power module 1a in FIG. 3, and are not redundantly described herein. In the embodiment, the power module 1g includes at least one first electronic device 71 and at least one second electronic device 72 disposed on the third side 51 and the fourth side 52 of the second board 50, respectively. Meanwhile, the first electronic device 71 is disposed on the third wiring layer 53, which are disposed on the third side 51 of the second board 50. The leading pin of the first electronic device 71 and the third wiring layer 53 on the third side 51 of the second board 50 are connected with each other through a solder (not shown). The first electronic device 71 is disposed between the two power devices 60. In the embodiment, the first board 10 includes at least one accommodation opening 10a, so the first board 10 exposes at least one partial region 52b of the fourth side 52 of the second board 50. The second electronic device 72 is received within the accommodation opening 10a and disposed on the at least one partial region 52b of the fourth side 52. Thus, with the magnetic component 20, the first conductive component 30 and the second conductive component 40 embedding in the first board 10, it benefits to optimize and integrate the connection of the magnetic component 20, the power device 60, the first electronic device 71 and the second electronic device 72. Consequently, the power module 1g with high efficiency, high power density and high heat dissipation capacity is achieved. The occupied space of the power module 1g relative to the system motherboard can be decreased, so that the product with the power module 1g is more competitive.

Based on the structure of the power module 1 in the foregoing embodiment, the present disclosure also provides a manufacturing method of a power module. Please refer to FIGS. 2 and 12. FIG. 12 is a flow chart illustrating a manufacturing method of a power module according to an embodiment of the present disclosure. Firstly, in the step S1, a first board 10 and a magnetic component 20 are provided. In the embodiment, the first board 10 includes a first side 11, a second side 12, a first conductive component 30 and a second conductive component 40. The first side 11 and the second side 12 are opposite to each other. The first conductive component 30 and the second conductive component 40 are disposed between the first side 11 and the second side 12. The magnetic component 20 is disposed between the first side 11 and the second side 12 of the first board 10 and includes at least one magnetic core 23 and at least one winding 26. The at least one winding 26 includes a first conductive terminal 24 and a second conductive terminal 25, which are led out on the first side 11 and the second side 12 of the first board 10, respectively. The first end 31 of the first conductive component 30 is led out on the first side 11 of the first board 10, and the second end 32 of the first conductive component 30 is led out on the second side 12 of the first board 10. The first end 41 of the second conductive component 40 is led out on the first side 11 of the first board 10, and the second end 42 of the second conductive component 40 is led out on the second side 12 of the first board 10. In the embodiment, the first board 10 further includes a first wiring layer 13 and a second wiring layer 14. The first wiring layer 13 and the second wiring layer 14 are disposed on the first side 11 and the second side 12, respectively. The first conductive component 30 and the second conductive component 40 are electrically connected between the first wiring layer 13 and the second wiring layer 14, respectively. The first conductive terminal 24 and the second conductive terminal 25 of the at least one winding 26 are electrically connected between the first wiring layer 13 and the second wiring layer 14, respectively.

Then, in the step S2, a second board 50 is provided and disposed on the first board 10. In the embodiment, the second board 50 includes a third side 51 and a fourth side 52. The third side 51 and the fourth side 52 are opposite to each other, and the fourth side 52 faces the first side 11 of the first board 10. Moreover, the second board 50 includes a third wiring layer 53 and a fourth wiring layer 54. The third wiring layer 53 and the fourth wiring layer 54 are disposed on the third side 51 and the fourth side 52, respectively, and electrically connected to each other. In another embodiment, the second board 50 further includes a fifth wiring layer 55. The fifth wiring layer 55 is disposed between the third side 51 and the fourth side 52 and at least electrically connected to the third wiring 53 or the fourth wiring layer 54. In addition, the fourth wiring layer 54 on the fourth side 52 of the second board 50 is connected to the first wiring layer 13 on the first side 11 of the first board 10 through for example but not limited to a solder 80 or other connection meanings.

Thereafter, in the step S3, at least one power device 60 is provided. The power device 60 includes at least one conductive terminal 61. Finally, in the step S4, the at least one power device 60 is disposed on the third side 51 of the second board 50, and the conductive terminal 61 of the power device 60 is electrically connected to the first board 10 through the second board 50. Preferably but not exclusively, the conductive terminal 61 of the power device 60 is electrically connected to the third wiring layer 53 on the third side 51 of the second board 50 by a conductive adhesive 81 or other connection meanings. Moreover, in the embodiment, preferably but not exclusively, the power device 60 and the second board 50 are soldered together and complete the test. Then, the second board 50 with the power device 60 is soldered to the first board 10, so that the power device 60 is electrically connected to the first board 10 through the second board 50. In an embodiment, the power device 60, the first board 10 and the second board 50 can be soldered simultaneously. In other embodiment, the first board 10 and the second board 50 are soldered together and then the power device 60 is soldered thereon. The present disclosure is not limited thereto and not redundantly described herein.

Notably, the magnetic component 20, the first conductive component 30 and the second conductive component 40 are embedded in the first board 10 and electrically connected between the first wiring layer 13 on the first side 11 and the second wiring layer 14 on the second side 12 of the first board 10, and it benefits to enhance the flexibility of the arrangement of the power device 60 and optimize and integrate the connection of the magnetic component 20 and the power device 60. Thus, the power module 1 with high efficiency, high power density and high heat dissipation capacity is achieved. The occupied space of the power module 1 relative to the system motherboard can be decreased, so that the product with the power module 1 is more competitive.

The detailed process of combining the first board 10 with the magnetic component 20, the first conductive component 30 and the second conductive component 40 will be further described in the following. It has to be emphasized that the manufacturing process is mostly produced in form of continuous panels. For ease of explanation, only one unit will be described in the following embodiment. The present disclosure is not limited thereto.

Figure 13A:
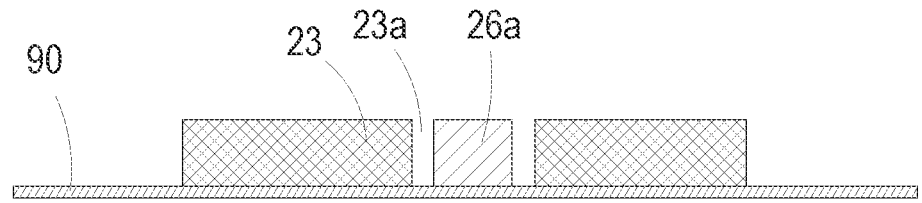
FIGS. 13A to 13E show a manufacturing process of the first board combined with other components according to a first embodiment of the present disclosure.
Figure 13B:
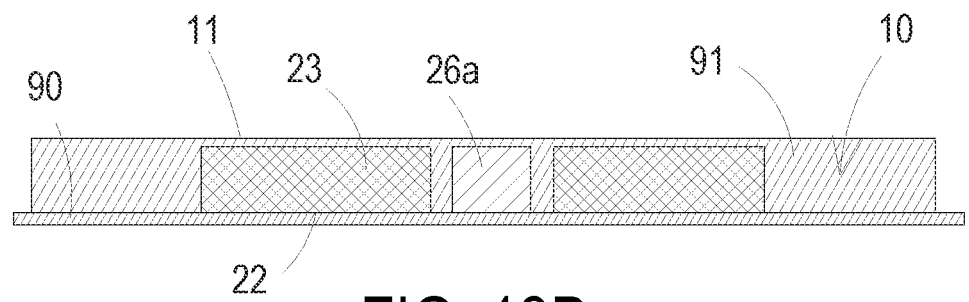
Figure 13C:
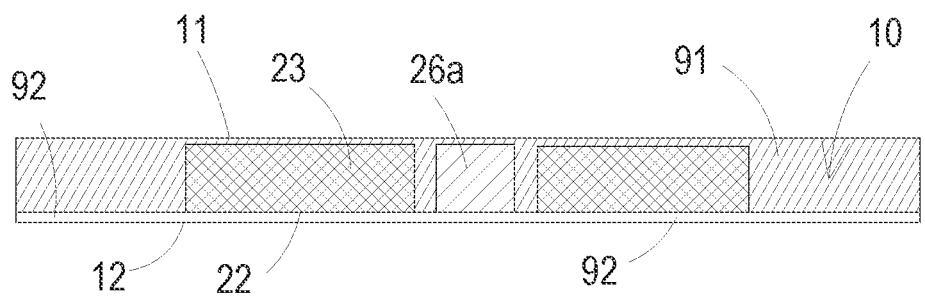
Figure 13D:
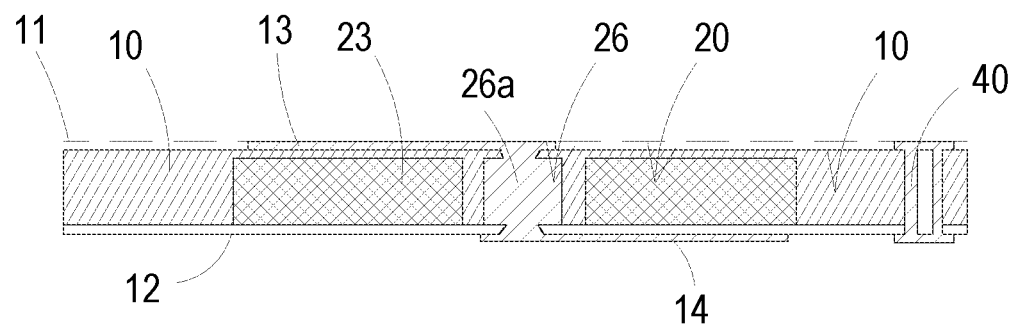
Figure 13E:
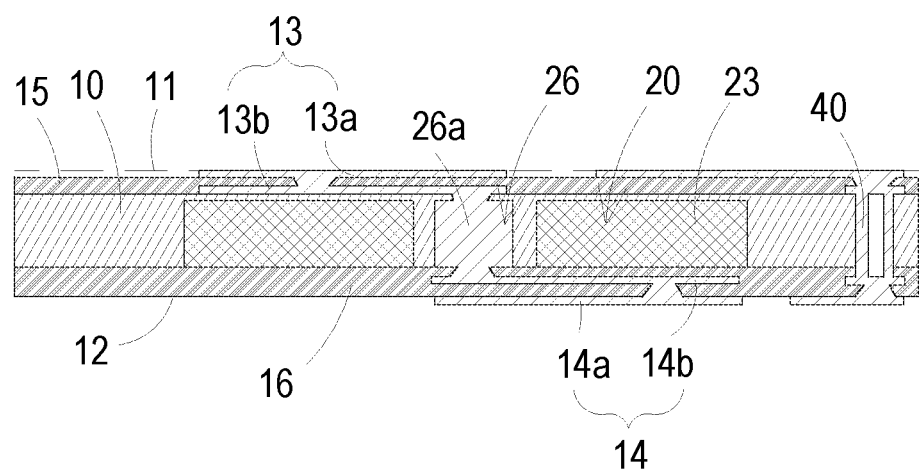

FIGS. 13A to 13E show a manufacturing process of the first board combined with other components according to a first embodiment of the present disclosure. In the embodiment, a release film 90 is provided firstly. The release film 90 provides temporary fixation during the manufacturing process. Then, at least one magnetic core 23 and at least one connection element 26a are provided to dispose on the release film 90, as shown in FIG. 13A. In the embodiment, the at least one magnetic core 23 includes at least one opening region 23a, and the at least one connection element 26a is received within the opening region 23a. Thereafter, a first insulation material layer 91 is covered on the release film 90, the at least one connection element 26a and the at least one magnetic core 23 to form the first side 11 of the first board 10, as shown in FIG. 13B. Afterward, the release film 90 is removed to expose a bottom surface 22 of the at least one magnetic core 23 and a bottom surface of the at least one connection element 26a. In addition, a second insulation material layer 92 is covered on the bottom surface 22 of the at least one magnetic core 23 and the bottom surface of the at least one connection element 26a to form the second side 12 of the first board 12 as shown in FIG. 13C. Finally, a first wiring layer 13 and a second wiring layer 14 are formed on the first side 11 and the second side 12, respectively, by drilling and metallization wiring. The first wiring layer 13 and the second wiring layer 14 are electrically connected with each other through the at least one connection element 26a to form the at least one winding 26 of the magnetic component 20. In the embodiment, preferably but not exclusively, when the metallization wiring is performed to form the first wiring layer 13 and the second wiring layer 14, a conductive via is formed as a second conductive component 40 between the first side 11 and the second side 12 of the first board 10, as shown in FIG. 13D. Notably, in other embodiments, the step of covering the second insulation material layer 92 can be omitted and the second wiring layer 14 is disposed on the bottom surface. Moreover, a part of the first insulation material layer 91 is removed to expose the top surface 21 of the magnetic core 23, and the first wiring layer 13 is disposed thereon. In an embodiment, at least two connection elements 26a are received within the at least two opening regions 23a, respectively. The first wiring layer 13, the second wiring layer 14 and the at least two connection elements 26a are electrically connected with each other to form the winding 26 of the magnetic component 20. In another embodiment, a plurality of connection elements 26a are received within the at least one opening regions 23a, respectively. The first wiring layer 13, the second wiring layer 14, the plurality of connection elements 26a, the at least one first conductive component 30 or the at least one second conductive component 40 are electrically connected with each other to form a multiple turns of windings 26 of the magnetic component 20. Preferably but not exclusively, in an embodiment, the first wiring layer 13 and the second wiring layer 14 can be a multilayer-wiring layer. As shown in FIG. 13E, the first board 10 further includes a first insulation body 15 and a second insulation body 16 disposed on the first side 11 and the second side 12, respectively. In the embodiment, the first wiring layer 13 includes a surface wiring layer 13a and an inner wiring layer 13b. The second wiring layer 14 includes a surface wiring layer 14a and an inner wiring layer 14b. The first wiring layer 13 and the second wiring layer 14 are disposed on the first insulation body 15 and the second insulation body 16, respectively. Certainly, the present disclosure is not limited thereto.

Figure 14A:
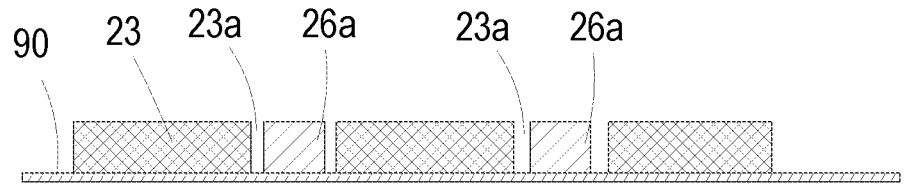
FIGS. 14A to 14D show a manufacturing process of the first board combined with other components according to a second embodiment of the present disclosure.
Figure 14B:
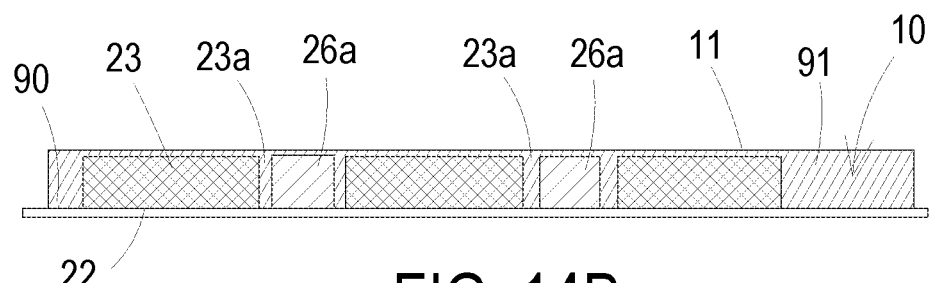
Figure 14C:
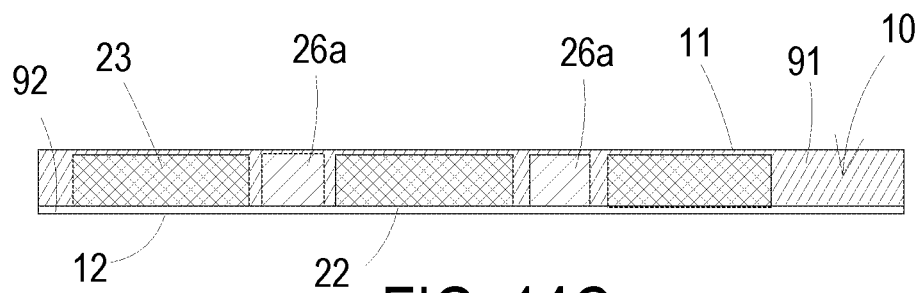
Figure 14D:
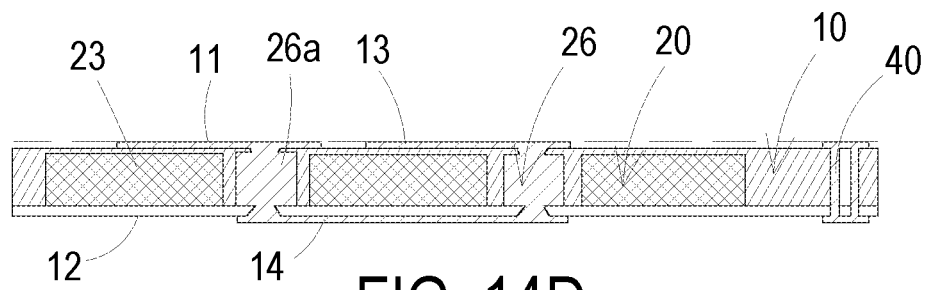

FIGS. 14A to 14D show a manufacturing process of the first board combined with other components according to a second embodiment of the present disclosure. In the embodiment, the structures, elements and functions of the first board 10 and other components are similar to those of the first board 10 and other components in FIGS. 13A to 13E and are not redundantly described herein. In the embodiment, the magnetic core 23 includes at least two opening regions 23a, at least two connection elements 26a are received within the at least two opening regions 23a, respectively, and the magnetic core 23 and the at least two connection elements 26a are disposed on the release film 90, as shown in FIG. 14A. Thereafter, a first insulation material layer 91 is covered on the release film 90, the at least two connection elements 26a and the magnetic core 23 to form the first side 11 of the first board 10, as shown in FIG. 14B. Afterward, the release film 90 is removed to expose a bottom surface 22 of the magnetic core 23 and bottom surfaces of the at least two connection elements 26a. In addition, a second insulation material layer 92 is covered on the bottom surface 22 of the magnetic core 23 and the bottom surfaces of the at least two connection elements 26a to form the second side 12 of the first board 10, as shown in FIG. 14C. Finally, the first wiring layer 13 and the second wiring layer 14 are formed on the first side 11 and the second side 12, respectively, by metallization wiring. Preferably but not exclusively, in the embodiment, the winding 26 of the magnetic component 20 is formed by the at least two connection elements 26a, the first wiring layer 13 and/or the second wiring layer 14. Notably, in other embodiments, the step of covering the second insulation material layer 92 can be omitted and the second wiring layer 14 is disposed on the bottom surface directly. Moreover, a part of the first insulation material layer 91 is removed to expose the top surface 21 of the magnetic core 23, and the first wiring layer 13 is disposed thereon. In the embodiment, preferably but not exclusively, when the metallization wiring is performed to form the first wiring layer 13 and the second wiring layer 14, a conductive via is formed as a second conductive component 40 between the first side 11 and the second side 12 of the first board 10, as shown in FIG. 14D. In an embodiment, a plurality of connection elements 26a are received within the at least one opening region 23a, respectively. The first wiring layer 13, the second wiring layer 14 and the plurality of connection elements 26a are electrically connected with each other to form a plurality of windings 26 of the magnetic component 20. In another embodiment, a plurality of connection elements 26a are received within the at least one opening regions 23a, respectively. The first wiring layer 13, the second wiring layer 14, the plurality of connection elements 26a, the at least one first conductive component 30 or the at least one second conductive component 40 are electrically connected with each other to form multiple turns of windings 26 of the magnetic component 20. Thus, with the magnetic component 20 and the second conductive component 40 embedding in the first board 10 and electrically connected between the first side 11 and the second side 12, it benefits to enhance the flexibility of the arrangement of the power device 60 and optimize and integrate the connection of the magnetic component 20 and the power device 60. Consequently, the power module 1 with high efficiency, high power density and high heat dissipation capacity is achieved. The occupied space of the power module 1 relative to the system motherboard can be decreased, so that the product with the power module 1 is more competitive.

Figure 15A:
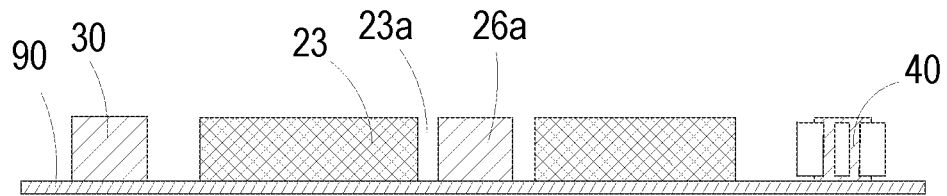
FIGS. 15A to 15D show a manufacturing process of the first board combined with other components according to a third embodiment of the present disclosure.
Figure 15B:
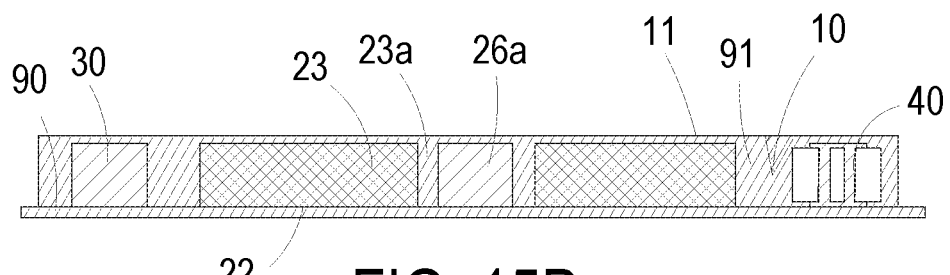
Figure 15C:
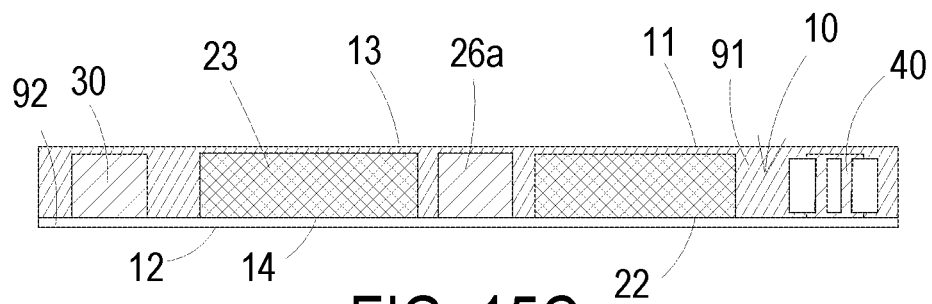
Figure 15D:
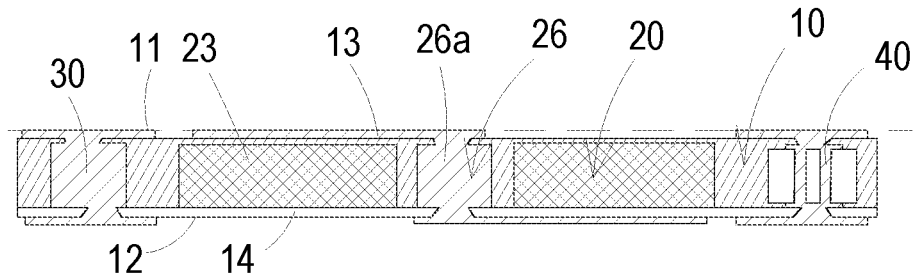

FIGS. 15A to 15D show a manufacturing process of the first board combined with other components according to a third embodiment of the present disclosure. In the embodiment, the structures, elements and functions of the first board 10 and other components are similar to those of the first board 10 and other components in FIGS. 14A to 14D and are not redundantly described herein. In the embodiment, the magnetic core 23 includes an opening region 23a. A connection element 26a is received within the opening region 23a. The connection element 26a, the preformed first conductive component 30 and the preformed second conductive component 40 are disposed on the release film 90 together, as shown in FIG. 15A. Preferably but not exclusively, the first conductive component 30 is a copper block and the second conductive component 40 is a circuit board having a conductive via. Thereafter, a first insulation material layer 91 is covered on the release film 90, the connection element 26a, the first conductive component 30, the second conductive component 40 and the magnetic core 23 to form the first side 11 of the first board 10, as shown in FIG. 15B. Afterward, the release film 90 is removed to expose a bottom surface 22 of the magnetic core 23 and a bottom surface of the connection element 26a. In addition, a second insulation material layer 92 is covered on the bottom surface 22 of the magnetic core 23 and the bottom surface of the connection element 26a to form the second side 12 of the first board 10, as shown in FIG. 15C. Finally, the first wiring layer 13 and the second wiring layer 14 are formed on the first side 11 and the second side 12, respectively, by metallization wiring. Preferably but not exclusively, in the embodiment, the winding 26 of the magnetic component 20 is formed by the connection element 26a, the first wiring layer 13 and the second wiring layer 14. In addition, when the metallization wiring is performed to form the first wiring layer 13 and the second wiring layer 14, the first conductive component 30 and the second conductive component 40 are electrically connected between the first side 11 and the second side 12 of the first board 10, as shown in FIG. 15D. In an embodiment, a plurality of connection elements 26a are received within the at least one opening region 23a, respectively. The first wiring layer 13, the second wiring layer 14 and the plurality of connection elements 26a are electrically connected with each other to form a plurality of windings 26 of the magnetic component 20. In another embodiment, a plurality of connection elements 26a are received within the at least one opening regions 23a, respectively. The first wiring layer 13, the second wiring layer 14, the plurality of connection elements 26a, the at least one first conductive component 30 or the at least one second conductive component 40 are electrically connected with each other to form a multiple turns of windings 26 of the magnetic component 20. Thus, with the arrangement of the magnetic component 20, the first conductive component 30 and the second conductive component 40 embedded in the first board 10 and electrically connected between the first side 11 and the second side 12, it benefits to enhance the flexibility of the arrangement of the power device 60 and optimize and integrate the connection of the magnetic component 20 and the power device 60. Consequently, the power module 1 with high efficiency, high power density and high heat dissipation capacity is achieved. The occupied space of the power module 1 relative to the system motherboard can be decreased, so that the product with the power module 1 is more competitive.

Figure 16C:
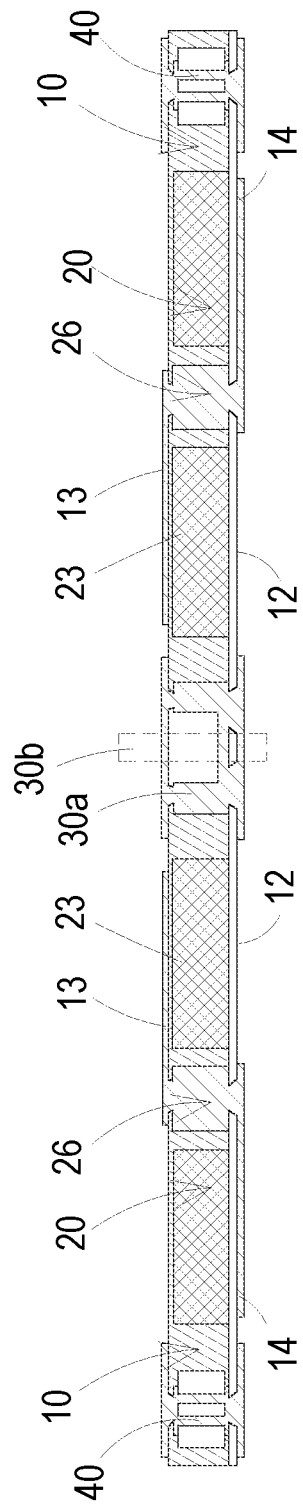
Figure 16D:
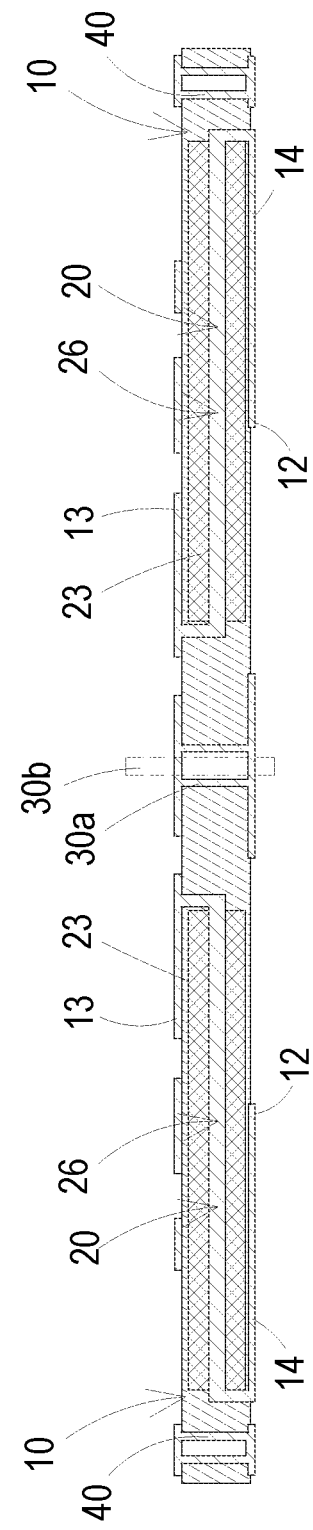

FIGS. 16A to 16D show a manufacturing process of the first board combined with other components according to a fourth embodiment of the present disclosure. In the embodiment, the structures, elements and functions of the first board 10 and other components are similar to those of the first board 10 and other components in FIGS. 15A to 15D and are not redundantly described herein. In the embodiment, the magnetic component 20, the first conductive component 30 and the second conductive component 40 are embedded in the first board 10, as shown in FIG. 16A. For mass production, two sets of the first boards 10, the second conductive components 40, the magnetic cores 23 and the connection elements 26a are symmetrically disposed on the release film 90 (referring to FIG. 15A). In the embodiment, an auxiliary connection element 30a, for example but not limited to a copper block, is further disposed between the two sets of the first boards 10, the second conductive components 40, the magnetic cores 23 and the connection elements 26a, as shown in FIG. 16B. After the first wiring layer 13 and the second wiring layer 14 are formed by a similar process as described in the foregoing embodiment, the auxiliary connection element 30a is cut to remove a partial region 30b thereof to form the two first conductive components 30 of the two first boards 10, respectively, as shown in FIG. 16A. In an embodiment, preferably but not exclusively, a U-shaped metal component as the auxiliary connection element 30a (as shown in FIG. 16C) is utilized to make two of first conductive components 30. After the fabrication of connection panels is completed, it is divided into two parts and formed two adjacent modules. In that, it benefits to reduce the amount of cutting, and the cost can be reduced by utilizing the sheet metal forming. Furthermore, when the U-shaped metal component is implemented to the auxiliary connection element 30a, the angle between the vertical portion and the bottom surface is not limited to 90 degrees. Preferably but not exclusively, the vertical portion can be further inclined within 15 degrees to eliminate a certain tolerance in the thickness direction. In another embodiment, as shown in FIG. 16D, the first conductive components 30 is formed by an auxiliary connection element 30a, which is a metal component formed by metallization and disposed on lateral walls of a slotted opening on the insulation material layer. After the fabrication of connection panels is completed, it is divided into two parts and formed two adjacent modules. Furthermore, in order to reduce the conduction resistance in the vertical direction, a metalized via connected to the lateral metallization layer in parallel can be provided, so that it benefits to improve the structural stability. Namely, in addition to integrating the first conductive component 30, the second conductive component 40 and the magnetic component 20 between the first side 11 and the second side 12 of the first board 10, the manufacturing process of embedding the first conductive component 30, the second conductive component 40 and the magnetic component 20 in the first board 10 is simplified at the same time. It benefits to improve the production efficiency, and facilitate to achieve the purposes of assembling the optimized power module and reducing the manufacturing cost thereof.

Figure 17A:
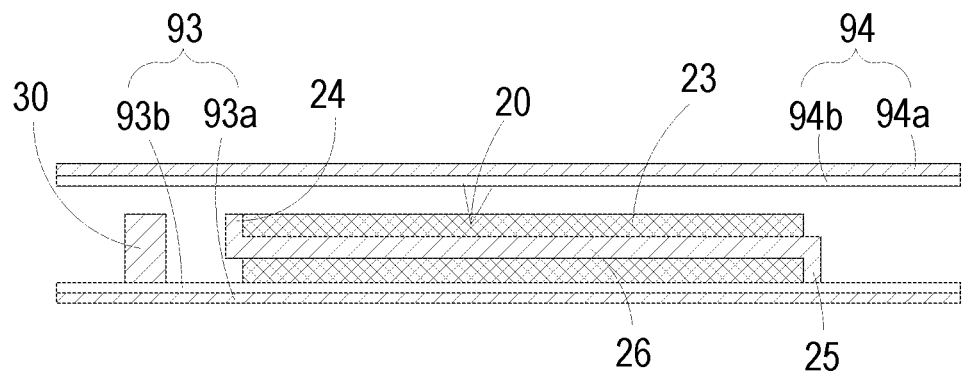
FIGS. 17A to 17E show a manufacturing process of the first board combined with other components according to a fifth embodiment of the present disclosure.
Figure 17B:
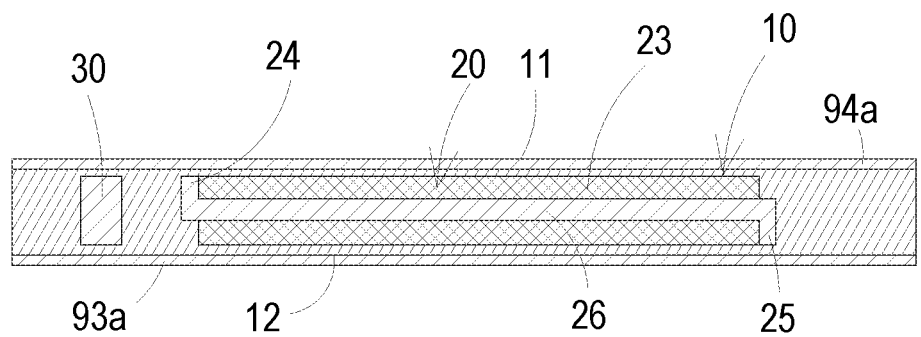
Figure 17C:
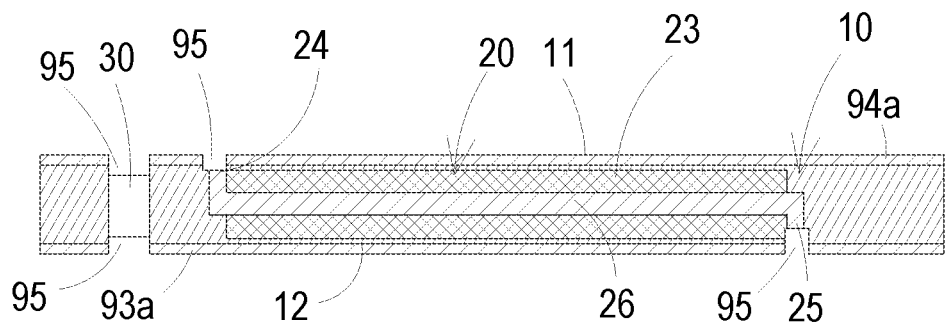
Figure 17D:
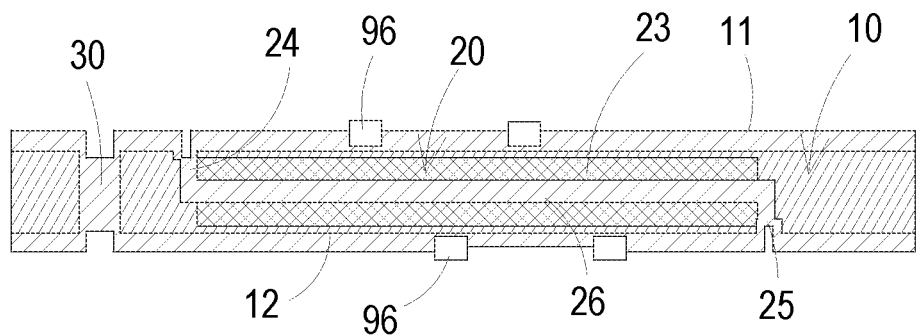
Figure 17E:
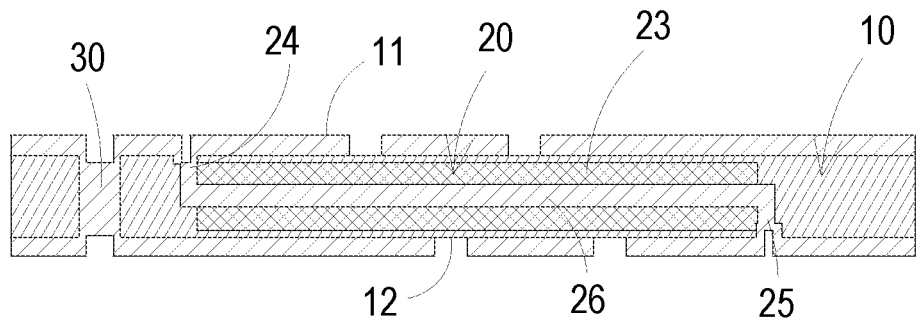
Figure 18A:
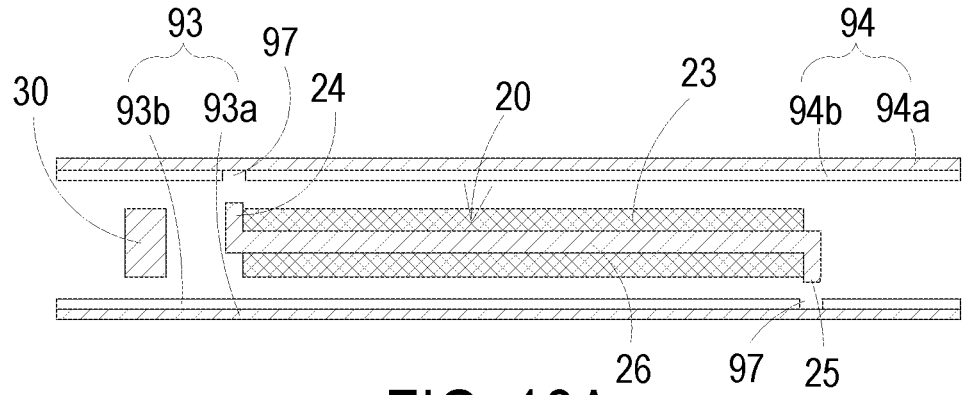
FIGS. 18A to 18C show the other exemplary structures of the first board and the second board combined with the magnetic component of the present disclosure.
Figure 18B:
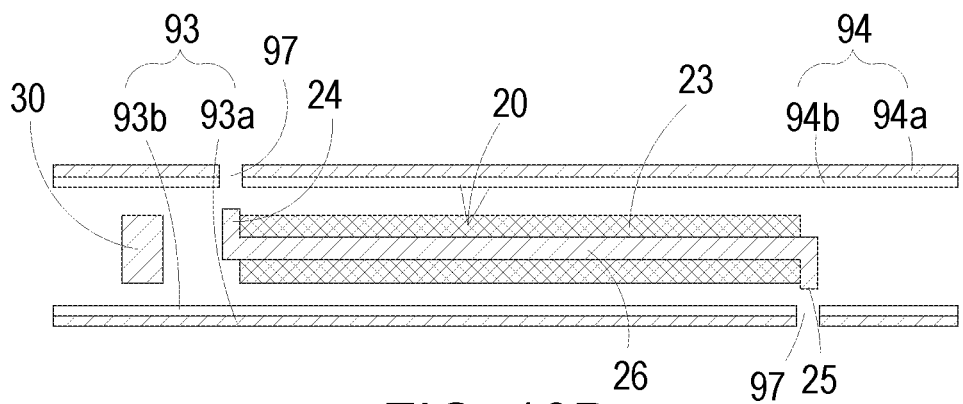
Figure 18C:
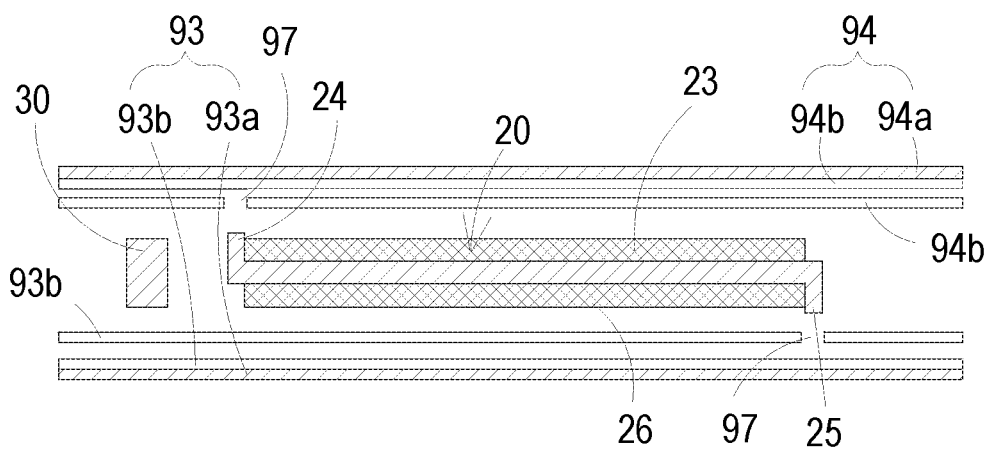

FIGS. 17A to 17E show a manufacturing process of the first board combined with other components according to a fifth embodiment of the present disclosure. In the embodiment, the structures, elements and functions of the first board 10 and other components are similar to those of the first board 10 and other components in FIGS. 13A to 13E and are not redundantly described herein. In the embodiment, the first board 10 is assembled with the other components by laminating process. Firstly, a first plate board 93, a second plate board 94, a magnetic component 20 and at least one first conductive component 30 are provided. In the embodiment, the first plate board 93 includes a first metal layer 93a and a first insulation material layer 93b. The second plate board 94 includes a second metal layer 94a and a second insulation material layer 94b. Preferably but not exclusively, the magnetic component 20 and the at least one first conductive component 30 are pre-disposed on the first insulation material layer 93b of the first plate board 93, as show in FIG. 17A. In some embodiments, at least one adhesive layer is formed between any two of the magnetic component 20, the at least one first conductive component 30 and the first insulation material layer 93b. Then, the first plate board 93 and the second plate board 94 are laminated together to form the first side 11 and the second side 12 of the first board 10. In the embodiment, the second insulation material layer 94b of the second plate board 94 faces the first insulation material layer 93b of the first plate board 93. The magnetic component 20 and the at least one first conductive component 30 are covered between the first metal layer 93a and the second metal layer 94a, as shown in FIG. 17B. In some embodiments, the first insulation material layer 93b and the second insulation material layer 94b can include a flowable insulation material, which forms a final insulation material layer during lamination. In an embodiment, the first metal layer 93a and the first insulation material layer 93b of the first plate board 93 are separated layers, respectively. In an embodiment, the second metal layer 94a and the second insulation material layer 94b of the second plate board 94 are separated layers, respectively. In an embodiment, the first plate board 93 includes a plurality of first insulation material layers 93b. In an embodiment, the second plate board 94 includes a plurality of second insulation material layers 94b. In an embodiment, the first plate board 93 includes a plurality of first insulation material layers 93b, and the first metal layer 93a and at least one of the first insulation material layers 93b are prefabricated together. The preformed first insulation material layer 93b has no liquidity during lamination, but at least one of other first insulation material layers 93b has liquidity during lamination. In an embodiment, the second plate board 94 includes a plurality of second insulation material layers 94b, and the second metal layer 94a and at least one of the second insulation material layers 94b are prefabricated together. The preformed second insulation material layer 94b has no liquidity during lamination, but at least one of other second insulation material layers 94b has liquidity during lamination. Certainly, the first plate board 93 and the second plate board 94 are adjustable according to the practical requirements. FIGS. 18A to 18C show the other exemplary structures of the first board and the second board combined with the magnetic component of the present disclosure. The present disclosure is not limited thereto and not redundantly described herein.

Notably, in case that the first conductive terminal 24 and the second conductive terminal 25 of the at least one winding 26 of the magnetic component 20 protrude from the top surface 21 and the bottom surface 22 of the at least one magnetic core 23, the first plate board 93 or the second plate board 94 further includes at least one accommodation space or opening window 97 spatially corresponding to the first conductive terminal 24 or the second conductive terminal 25, so as to ensure the smooth progress of the process. Preferably but not exclusively, the opening window 97 is partially located through the first plate board 93, or completely runs through the first plate board 93. Similarly, the opening window 97 is partially located through the second plate board 94 or completely runs through the second plate board 94. In addition to facilitating the manufacturing process, the spaced distance between any two of the first conductive terminal 24 and the second conductive terminal 25 of the at least one winding 26 of the magnetic component 20, the first metal layer 93a of the first plate board 93 and the second metal layer 94a of the second plate board 94 can be reduced. It is beneficial to reduce the connection resistance and the removal amount of the insulation material. Thereafter, a plurality of slotted openings 95 are formed by for example but not limited to the laser drilling/slotting, or the mechanical drilling/slotting. The plurality of slotted openings 95 run through the first metal layer 93a and the second metal layer 94a, so as to expose the at least one first conductive component 30 and the first conductive terminal 24 and the second conductive terminal 25 of the at least one winding 26, as shown in FIG. 17C. Afterward, a thin copper layer is formed on the surface by chemical plating and then a photoresist layer 96 is formed on the first layer 93a and the second metal layer 94a. The thicknesses of the first metal layer 93a and the second metal layer 94a are increased in accordance with the pattern of the photoresist layer 96, as shown in FIG. 17D. Finally, a tin-lead pattern plating is preformed through the photoresist layer 96, and then the photoresist layer 96 is removed. The copper layer is further etched with the protection of the tin-lead layer. In that, the first wiring layer 13 and the second wiring layer 14 are formed, as shown in FIG. 17E. Alternatively, the first wiring layer 13 and the second wiring layer 14 are formed by means of plating over the whole surface after the slotted openings 95 being formed to increase the thickness of the copper layer and then etching in accordance with the pattern of the photoresist layer. In the embodiment, the first board 10 is formed and includes the first wiring layer 13 and the second wiring layer 14 disposed on the first side 11 and the second side 12, respectively. The first wiring layer 13 and the second wiring layer 14 are electrically connected to each other through the at least one first conductive component 30. Moreover, the first conductive terminal 24 and the second conductive terminal 25 of the at least one winding 26 are led out through the first side 11 and the second side 12 of the first board 10, respectively. Thus, the magnetic component 20 and the first conductive component 30 are embedded in the first board 10 and electrically connected between the first side 11 and the second side 12, it benefits to enhance the flexibility of the arrangement of the power device 60 and optimize and integrate the connection of the magnetic component 20 and the power device 60. Consequently, the power module 1 with high efficiency, high power density and high heat dissipation capacity is achieved. The occupied space of the power module 1 relative to the system motherboard can be decreased, so that the product with the power module 1 is more competitive.

Figure 19A:
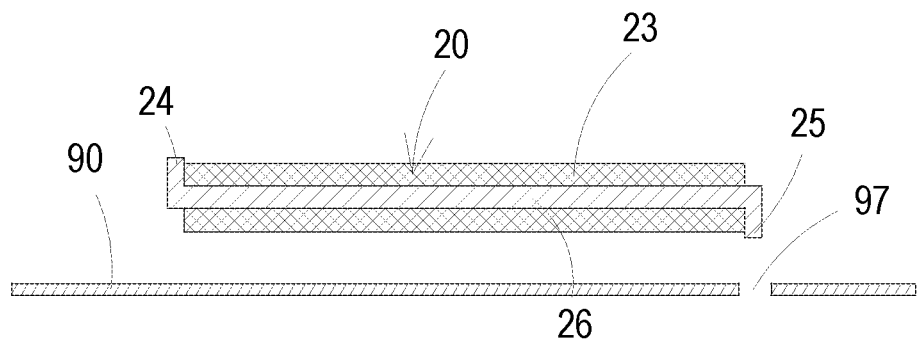
FIGS. 19A to 19B show a manufacturing process of disposing the magnetic component on the release film according to another embodiment of the present disclosure.
Figure 19B:
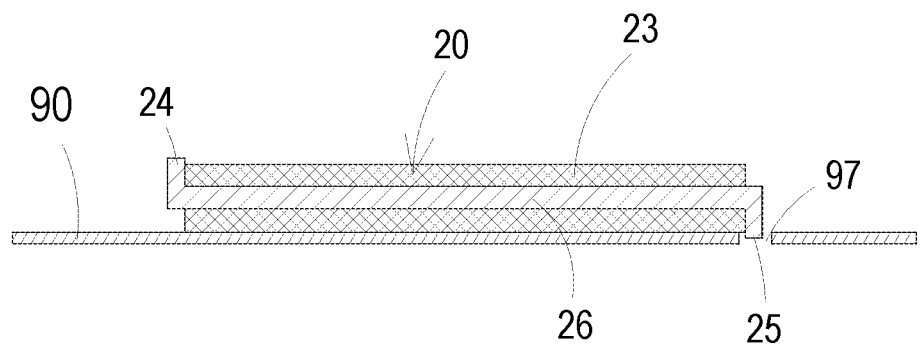

In addition, FIGS. 19A to 19B show a manufacturing process of disposing the magnetic component on the release film according to another embodiment of the present disclosure. Notably, in case that the first conductive terminal 24 and the second conductive terminal 25 of the at least one winding 26 of the magnetic component 20 protrude from the top surface 21 and the bottom surface 22 of the at least one magnetic core 23, the first plate board 93 and the second plate board 94 can include the opening windows 97 spatially corresponding to the first conductive terminal 24 or the second conductive terminal 25, to ensure the smooth progress of the process. Alternatively, in case that the release film 90 is implemented to carry the magnetic component 20, the release film 90 can include an opening window 97 spatially corresponding to the first conductive terminal 24 or the second conductive terminal 25. In that, when the magnetic component 20 is attached to the release film 90 and carried on the release film 90, the first conductive terminal 24 or the second conductive terminal 25 is at least partially located through the opening window 97, so as to achieve the foregoing effect. The present disclosure is not limited thereto.

Figure 20C:
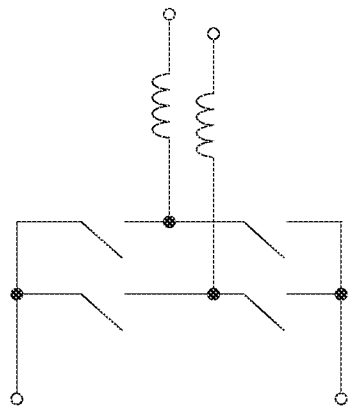
FIG. 20C is a circuit diagram illustrating multiple sets of switching devices and multiple inductors configured within the power module of the present disclosure.
Figure 20B:
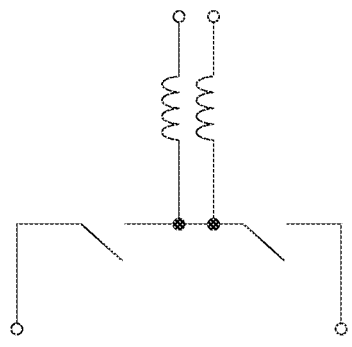
FIG. 20B is a circuit diagram illustrating one set of switching device and multiple inductors configured within the power module of the present disclosure.
Figure 20A:
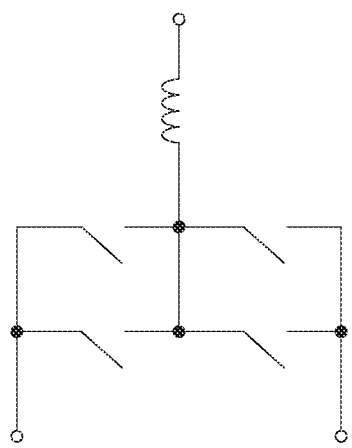
FIG. 20A is a circuit diagram illustrating multiple sets of switching devices and one inductor configured within the power module of the present disclosure.

Based on the foregoing descriptions, it is understood that the power module 1 of the present disclosure is adjustable according to practical requirements. In the case of a typical buck circuit, the power module 1 of the present disclosure may have circuit variations similar to those shown in FIGS. 20A to 20C for different applications. For example, multiple sets of switching devices can be configured with one inductor (as shown in FIG. 20A), one set of switching device can be configured with multiple inductors (as shown in FIG. 20B), or multiple sets of switching devices can be configured with multiple inductors (as shown in FIG. 20C). The structural design of the power module and the design of the circuit pattern of the present disclosure can be slightly modified to achieve the different applications. In the case of the configuration with multiple inductors, a plurality of individual inductors or coupled inductors can be implemented by a circuit pattern design. The present disclosure is not limited thereto.

In summary, the present disclosure provides a power module and a manufacturing method thereof. With a magnetic component and a conductive component embedded in a board and connected between the wiring layers on two sides of the board, the flexibility of arrangements of the power device and other electronic devices can be enhanced, and the connection of the magnetic component and the power device can be optimized and integrated. Consequently, a power module with high efficiency, high power density and high heat dissipation capacity is achieved. The occupied space of the power module on the system motherboard can be decreased, so that the product with the power module is more competitive. The optimized and integrated power module can be varied to meet different application requirements, increase the design variability and further optimize the circuit characteristics of the power module. Meanwhile, more functions are integrated into the power module. Moreover, with the copper blocks, the conductive vias, the leading frames or the circuit board combined with the magnetic component and integrated between the wiring layers on two sides of the board, it simplifies the art of embedding the magnetic component and the conductive components within the board, so as to improve the production efficiency, and facilitate to achieve the purposes of assembling the optimized power module and reducing the manufacturing cost thereof.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module comprising:
    a first board comprising a first side, a second side and at least one conductive component, wherein the first side and the second side are opposite to each other, and the at least one conductive component is disposed between the first side and the second side;
    a magnetic component disposed between the first side and the second side of the first board and comprising at least one magnetic core and at least one winding, wherein the at least one winding comprises a first conductive terminal and a second conductive terminal led out on the first side and the second side of the first board, respectively;
    a second board disposed on the first board and comprising a third side and a fourth side, wherein the third side and the fourth side are opposite to each other, and the fourth side faces the first side;
    at least one power device disposed on the third side of the second board and electrically connected to the first board through the second board; and
    the at least one conductive component and the at least one winding are led out on the second side of the first board to collaboratively form all terminals of the power module.

2. The power module according to claim 1, wherein the first board further comprises a first wiring layer and a second wiring layer, the first wiring layer and the second wiring layer are disposed on the first side and the second side, respectively, and the at least one conductive component is electrically connected between the first wiring layer and the second wiring layer.

3. The power module according to claim 2, wherein the first board further comprises at least one insulation body disposed between the first wiring layer and the second wiring layer to form an insulation material layer covering the magnetic component, and the first conductive terminal and the second conductive terminal are electrically connected to the first wiring layer and the second wiring layer, respectively.

4. The power module according to claim 3, wherein at least one of the first wiring layer and the second wiring layer includes a multilayer-wiring layer.

5. The power module according to claim 1, wherein the at least one conductive component is a copper block, a conductive via, a leading frame or a circuit board.

6. The power module according to claim 1, wherein the second board comprises a third wiring layer and a fourth wiring layer disposed on the third side and the fourth side, respectively, and the second board comprises a fifth wiring layer disposed between the third side and the fourth side and electrically connected to the third wiring layer and the fourth wiring layer.

7. The power module according to claim 1, further comprising at least one electronic device disposed on one of the first side, the third side and the fourth side, wherein the at least one electronic device is a capacitor, a resistor or a driver.

8. The power module according to claim 1, further comprising at least one electronic device, wherein the second board exposes at least one margin region of the first side of the first board, and the at least one electronic device is disposed on the margin region of the first side, wherein the at least one electronic device is a capacitor, a resistor or a driver.

9. The power module according to claim 1, further comprising at least one electronic device, wherein the second board comprises at least one accommodation opening, and the at least one electronic device is received within the at least one accommodation opening and disposed on the first side, wherein the at least one electronic device is a capacitor, a resistor or a driver.

10. The power module according to claim 1, further comprising at least one electronic device, wherein the first board exposes at least one margin region of the fourth side of the second board, and the at least one electronic device is disposed on the margin region of the fourth side, wherein the at least one electronic device is a capacitor, a resistor or a driver.

11. The power module according to claim 1, further comprising at least one electronic device, wherein the first board comprises at least one accommodation opening, and the at least one electronic device is received within the at least one accommodation opening and disposed on the fourth side, wherein the at least one electronic device is a capacitor, a resistor or a driver.

12. A manufacturing method of a power module, comprising steps of:
- (a) providing a first board and a magnetic component, wherein the first board comprises a first side, a second side and at least one conductive component, the first side and the second side are opposite to each other, and the at least one conductive component is disposed between the first side and the second side, wherein the magnetic component is disposed between the first side and the second side of the first board and comprises at least one magnetic core and at least one winding, and the at least one winding comprises a first conductive terminal and a second conductive terminal led out on the first side and the second side of the first board, respectively;
- (b) providing a second board, wherein the second board is disposed on the first board and comprises a third side and a fourth side, the third side and the fourth side are opposite to each other, and the fourth side faces the first side; the at least one conductive component and the at least one winding are let out on the second side of the first board to collaboratively form all terminals of the power module;
- (c) providing at least one power device; and
- (d) disposing the at least one power device on the third side of the second board, wherein the at least one power device is electrically connected to the first board through the second board.

13. The manufacturing method of the power module according to claim 12, wherein the step (a) further comprises steps of:
- (a11) providing a release film;
- (a12) providing the at least one magnetic core and at least one connection element disposed on the release film, wherein the at least one magnetic core comprises at least one opening region, and the at least one connection element is received within the opening region;
- (a13) covering a first insulation material layer on the release film, the at least one connection element and the at least one magnetic core to form the first side of the first board;
- (a14) removing the release film to expose a bottom surface of the at least one magnetic core and a bottom surface of the at least one connection element;
- (a15) covering a second insulation material layer on the bottom surface of the at least one magnetic core and the bottom surface of the at least one connection element to form the second side of the first board; and
- (a16) forming a first wiring layer and a second wiring layer on the first side and the second side, respectively, wherein the first wiring layer and the second wiring layer are electrically connected with each other through the at least one connection element to form the at least one winding of the magnetic component.

14. The manufacturing method of the power module according to claim 13, further comprising a step of (a17) forming the at least one conductive component disposed between the first side and the second side and electrically connected to the first wiring layer and the second wiring layer.

15. The manufacturing method of the power module according to claim 13, wherein the first board further comprises a first insulation body and a second insulation body disposed on the first side and the second side, respectively, wherein the first wiring layer and the second wiring layer are disposed on the first insulation body and the second insulation body, respectively, the magnetic component is disposed between the first insulation body and the second insulation body, and the at least one winding of the magnetic component is formed by the at least one connection element, the first wiring layer and the second wiring layer.

16. The manufacturing method of the power module according to claim 13, wherein the at least one opening region comprises at least two opening regions, and the at least one connection element comprises at least two connection elements, wherein the at least two connection elements are received within the at least two opening regions, respectively, wherein the at least one winding of the magnetic component is formed by the at least two connection elements and at least one of the first wiring layer and the second wiring layer.

17. The manufacturing method of the power module according to claim 16, wherein in the step (a12), the at least one magnetic core comprises at least two magnetic cores, and the at least two magnetic cores and at least one auxiliary connection element are provided to dispose on the release film, wherein the two magnetic cores are adjacent to each other and the at least one auxiliary connection element is disposed between the two magnetic cores.

18. The manufacturing method of the power module according to claim 17, wherein the at least one auxiliary connection element is a U-shaped metal component or a metal component disposed on a lateral wall of a slotted opening on the first insulation material layer or the second insulation material layer.

19. The manufacturing method of the power module according to claim 17, further comprising a step of (a18) cutting the at least one auxiliary connection element to form the at least two conductive components of the two first boards, respectively.

20. The manufacturing method of the power module according to claim 13, wherein the first conductive terminal and the second conductive terminal of the at least one winding protrude from a top surface and a bottom surface of the at least one magnetic core, the release film comprises at least one opening window spatially corresponding to the first conductive terminal or the second conductive terminal, and the first conductive terminal or the second conductive terminal runs through the at least one opening window of the release film.

21. The manufacturing method of the power module according to claim 12, wherein the step (a) further comprises steps of:
- (a21) providing a first plate board, the magnetic component and the at least one conductive component, wherein the first plate board comprises a first metal layer and a first insulation material layer, and the magnetic component and the at least one conductive component are disposed on the first insulation material layer of the first plate board;
- (a22) providing a second plate board, wherein the second plate board comprises a second metal layer and a second insulation material layer;
- (a23) laminating the first plate board and the second plate board to form the first side and the second side of the first board, wherein the second insulation material layer of the second plate board faces the first insulation material layer of the first plate board, the magnetic component and the at least one conductive component are covered by the first insulation material layer or the second insulation material layer and located between the first metal layer and the second metal layer;
- (a24) forming a plurality of slotted openings running through the first metal layer and the second metal layer to expose the at least one conductive component and the first conductive terminal and the second conductive terminal of the at least winding; and
- (a25) forming a first wiring layer and a second wiring layer on the first side and the second side, respectively, wherein the first wiring layer and the second wiring layer are electrically connected with each other through the at least one conductive component, and the first conductive terminal and the second conductive terminal are led out on the first side and the second side of the first board, respectively.

22. The manufacturing method of the power module according to claim 21, wherein the step (a25) further comprises steps of:
- (a251) forming a photoresist layer on the first metal layer and the second metal layer, respectively; and
- (a251) performing a secondary copper and tin-lead plating and an etching through the photoresist layer and then removing the photoresist layer to form the first wiring layer and the second wiring layer.

23. The manufacturing method of the power module according to claim 21, wherein the first conductive terminal and the second conductive terminal of the at least one winding protrude from a top surface and a bottom surface of the at least one magnetic core, the first plate board or the second plate board comprises at least one opening window spatially corresponding to the first conductive terminal or the second conductive terminal, and the first conductive terminal or the second conductive terminal runs through the at least one opening window of the first plate board or the second plate board.

* * * * *